US011277021B2

(12) United States Patent
Han et al.

(10) Patent No.: US 11,277,021 B2
(45) Date of Patent: Mar. 15, 2022

(54) LED-BASED EMERGENCY LIGHTING EQUIPMENT AND METHODOLOGY

(71) Applicant: Hubbell Incorporated, Shelton, CT (US)

(72) Inventors: Lei Han, Greenville, SC (US); John Evan Lane, Simpsonville, SC (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 17/004,746

(22) Filed: Aug. 27, 2020

(65) Prior Publication Data

US 2020/0393101 A1 Dec. 17, 2020

Related U.S. Application Data

(60) Division of application No. 15/597,491, filed on May 17, 2017, now Pat. No. 10,794,555, which is a
(Continued)

(51) Int. Cl.
*F21S 9/02* (2006.01)
*F21V 21/30* (2006.01)
(Continued)

(52) U.S. Cl.
CPC ............... *H02J 7/02* (2013.01); *F21S 9/022* (2013.01); *F21V 21/30* (2013.01); *F21V 29/507* (2015.01);
(Continued)

(58) Field of Classification Search
USPC .......................................................... 307/66
See application file for complete search history.

(56) References Cited

U.S. PATENT DOCUMENTS 4,703,191 A 10/1987 Ferguson
4,742,290 A 5/1988 Sutphin et al.
(Continued)

FOREIGN PATENT DOCUMENTS

CN 101706079 5/2010
GB 2457313 8/2009
(Continued)

OTHER PUBLICATIONS

EV LED Series Esplosionproof LED Luminaires, Cooper Crouse-Hinds, 2012, www.crouse-hinds.com, pp. 899-902.
(Continued)

*Primary Examiner* — Toan T Vu
*Assistant Examiner* — Xuan Ly
(74) *Attorney, Agent, or Firm* — Michael Best & Friedrich LLP

(57) ABSTRACT

A brown-out detection apparatus including a voltage sensing circuit, a first circuit, and a second circuit. The voltage sensing circuit senses an input AC voltage having a first nominal input voltage value or a second nominal input voltage value. The voltage sensing circuit includes an output outputting a reference DC voltage proportional said input AC voltage. The first circuit is responsive to said output of said voltage sensing circuit. The first circuit includes a first output outputting a first voltage value when said input AC voltage is below a threshold voltage level and a second voltage value when said input AC voltage is above said threshold level. The second circuit is responsive to said first output. The second circuit includes a second output outputting a second control signal indicative of a brown-out condition of said input AC voltage.

15 Claims, 23 Drawing Sheets

Related U.S. Application Data continuation of application No. 13/670,327, filed on Nov. 6, 2012, now Pat. No. 9,667,096.

(51) Int. Cl.
| | |
|---|---|
| *F21V 29/507* | (2015.01) |
| *F21V 29/74* | (2015.01) |
| *H02J 7/00* | (2006.01) |
| *H02J 9/06* | (2006.01) |
| *H03K 5/24* | (2006.01) |
| *H05B 45/37* | (2020.01) |
| *H05B 45/50* | (2020.01) |
| *H02J 7/02* | (2016.01) |
| *H05B 45/56* | (2020.01) |
| *H02J 7/04* | (2006.01) |
| *F21Y 115/10* | (2016.01) |

(52) U.S. Cl.
CPC ............ *F21V 29/74* (2015.01); *H02J 7/0013* (2013.01); *H02J 7/0071* (2020.01); *H02J 7/00712* (2020.01); *H02J 7/00714* (2020.01); *H02J 7/022* (2013.01); *H02J 7/045* (2013.01); *H02J 9/061* (2013.01); *H03K 5/24* (2013.01); *H05B 45/56* (2020.01); *F21Y 2115/10* (2016.08); *H02J 7/007* (2013.01)

(56) References Cited

U.S. PATENT DOCUMENTS

| | | | |
|---|---|---|---|
| 5,457,450 A | 10/1995 | Deese et al. | |
| 5,697,175 A | 12/1997 | Schwartz | |
| 5,770,999 A | 6/1998 | Rhodes | |
| 5,929,781 A | 7/1999 | Vosika | |
| 6,107,985 A | 8/2000 | Walukas et al. | |
| 6,188,182 B1 | 2/2001 | Nikols et al. | |
| 6,220,722 B1 | 4/2001 | Begemann | |
| 6,285,140 B1 | 9/2001 | Ruxton | |
| 6,329,760 B1 | 12/2001 | Bebenroth | |
| 6,499,860 B2 | 12/2002 | Begemann | |
| 6,584,418 B2 | 6/2003 | Murphy et al. | |
| 6,614,579 B2 | 9/2003 | Roberts et al. | |
| 6,791,283 B2 | 9/2004 | Bowman et al. | |
| 7,015,636 B2 | 3/2006 | Bolta | |
| 7,088,059 B2 | 8/2006 | McKinney et al. | |
| 7,204,606 B2 | 4/2007 | Brass et al. | |
| 7,221,125 B2 | 5/2007 | Ding | |
| 7,227,336 B1 | 6/2007 | Van Schalkwijk et al. | |
| 7,234,844 B2 | 6/2007 | Bolta et al. | |
| 7,256,556 B2 * | 8/2007 | Lane ................ | H05B 41/28 315/308 |
| 7,501,768 B2 | 3/2009 | Lane et al. | |
| 7,690,802 B2 | 4/2010 | Higley et al. | |
| 7,737,640 B2 | 6/2010 | Marques | |
| 7,771,087 B2 | 8/2010 | Wilcox et al. | |
| 7,863,832 B2 | 1/2011 | Lane et al. | |
| 2004/0263091 A1 | 12/2004 | Deurloo et al. | |
| 2005/0057353 A1 | 3/2005 | Barrieau et al. | |
| 2006/0146553 A1 | 7/2006 | Zeng et al. | |
| 2007/0147025 A1 | 6/2007 | Shirey | |
| 2007/0211461 A1 | 9/2007 | Harwood | |
| 2008/0037257 A1 | 2/2008 | Bolta | |
| 2008/0089069 A1 | 4/2008 | Medendorp | |
| 2008/0212319 A1 | 9/2008 | Klipstein | |
| 2008/0212336 A1 | 9/2008 | Chae | |
| 2009/0026843 A1 | 1/2009 | Youn | |
| 2009/0079354 A1 | 3/2009 | Deurloo et al. | |
| 2011/0089839 A1 | 4/2011 | Chen | |

FOREIGN PATENT DOCUMENTS

| | | |
|---|---|---|
| RU | 2004110433 | 9/2005 |
| WO | 8810020 | 12/1998 |

OTHER PUBLICATIONS

EV LED Series Luminaires: Class I, Division I factory-sealed LED luminaire for general illumination, Engineering Safety & Productivity, Cooper Crouse-Hinds, pp. 1-8.

\* cited by examiner

LED-BASED EMERGENCY LIGHTING EQUIPMENT AND METHODOLOGY

RELATED APPLICATIONS

This application claims priority to, and is a divisional patent application of U.S. patent application Ser. No. 15/597,491, filed May 17, 2017, which claims priority to U.S. patent application Ser. No. 13/670,327, filed Nov. 6, 2012, the disclosures of both of which (including all attachments filed therewith) are hereby incorporated by reference in their entirety.

This application relates to U.S. Pat. No. 8,258,705 issued Sep. 4, 2012, and pending U.S. patent application Ser. No. 13/220,002 filed Aug. 29, 2011, the disclosures of which (including all attachments filed therewith) are hereby incorporated by reference in their entirety.

FIELD

Embodiments relate to the field of LED-based emergency lighting. Generally, LED-based emergency lighting systems, equipment and methodologies according to exemplary embodiments of the present application utilize AC-DC switch mode power conversion technology, NiMH battery technology, and emergency lighting lamps that use high power white LEDs as the emergency lighting source.

SUMMARY

For many years commercial two lamp emergency lighting unit designs have primarily been based around three key design elements to achieve costs that were acceptable in the marketplace while delivering reasonable levels of performance lighting the path of egress in emergency situations. These three design elements in most emergency lighting units include (1) Valve Regulated Lead Acid (VRLA) batteries, (2) incandescent DC lamps, and (3) 60 Hz transformer based voltage controlled chargers. These elements combine to provide typical entry level emergency lighting units that are widely used and stocked by electrical distributors to meet the basic emergency lighting needs.

The choice of these traditional design elements for emergency lighting units has typically been dictated by a narrow range of DC light sources that could light the path of egress from battery power after a loss of AC power to the unit. Incandescent lamps for many years were the only sources that could offer the amount of light required for the application at a reasonable price point. Traditional entry level emergency lighting units typically use two 6V 5.4 W incandescent lamps. Because these incandescent light sources have relatively low efficacy levels, the batteries required to power them for the 90 minute run times mandated by NFPA 101 life safety codes were heavy and bulky VRLA types. The typical battery size for most entry level emergency lighting units is the 6V 4 Ah VRLA battery. This battery size is convenient because it matches the voltage rating of the lamp and can deliver code mandated run times with two 6V 5.4 W incandescent lamp sources. The 6V system is also widely used because it allows the use of a simple relay to transfer the battery power to the lamps during emergency conditions when AC power is lost to a building.

Because the battery sizes of the traditional emergency lighting unit are relatively large the chargers used to keep the batteries in a fully charged state also have to be sized to charge these larger batteries. Typical entry level emergency lighting units employ a 60 Hz magnetic step down transformer and a voltage controlled charging regulator to provide a well regulated dc voltage source needed to maintain the batteries in a fully charged state. Thus, one of the problems for traditional emergency lighting units is the need for relatively large and heavy batteries and battery chargers.

With recent advances in white high power LED lighting technology LEDs have reached luminous output levels where they can provide light levels equivalent to the traditional lamps technologies at much lower power levels. Because of the higher level of efficacy for the LED source, much lower AC input power requirements can be achieved for general purpose lighting fixtures. This significant energy usage reduction for the LED source has driven rapid adoption of the LED as a light source in general purpose, normally on, lighting fixtures in recent years. While the advances in LED lighting technology have made the LED a viable replacement lighting source in general purpose lighting fixtures the costs associated with the LED light source are significantly higher than more established traditional light sources. The disadvantageous high costs are likewise associated with conventional emergency lighting units attempting to use LED light sources.

An exemplary embodiment of the present application provides LED-based emergency lighting system comprising AC-DC switch mode power converter, a rechargeable NiMH battery, and an emergency lighting lamp including high power white LED lighting source. In an exemplary implementation, a low voltage microprocessor based circuit design reduces the battery input voltage for the unit to a nominal level of 2.4 VDC.

According to an exemplary implementation of an embodiment of the present application, the system comprises a microprocessor executing a pulse charging algorithm to lower battery maintenance mode power consumption levels and extend the useful life of the battery.

In another exemplary implementation of an embodiment of the present application, a system utilizes brownout detection technology that does not require the determination of the AC input voltage level or transmission of the brownout detection signal to the secondary side of the circuit.

Yet another exemplary embodiment of the present application provides a method for charging a rechargeable battery by a charge current including sampling a voltage of the rechargeable battery and the charge current, and then setting the charge current based on the results of the sampling to a bulk charge value, a trickle charge high value, or a trickle charge low value.

Yet another exemplary embodiment of the present application provides a method for charging a rechargeable battery by a charge current including sampling a voltage of the rechargeable battery and the charge current, calculating a delta V/delta t value of the rechargeable battery voltage. Then the charge current is set based on the results of the sampling and the delta V/delta t calculation to a bulk charge value, a trickle charge high value, or a trickle charge low value.

Other aspects of the application will become apparent by consideration of the detailed description and accompanying drawings.

DETAILED DESCRIPTION

Figure 1:
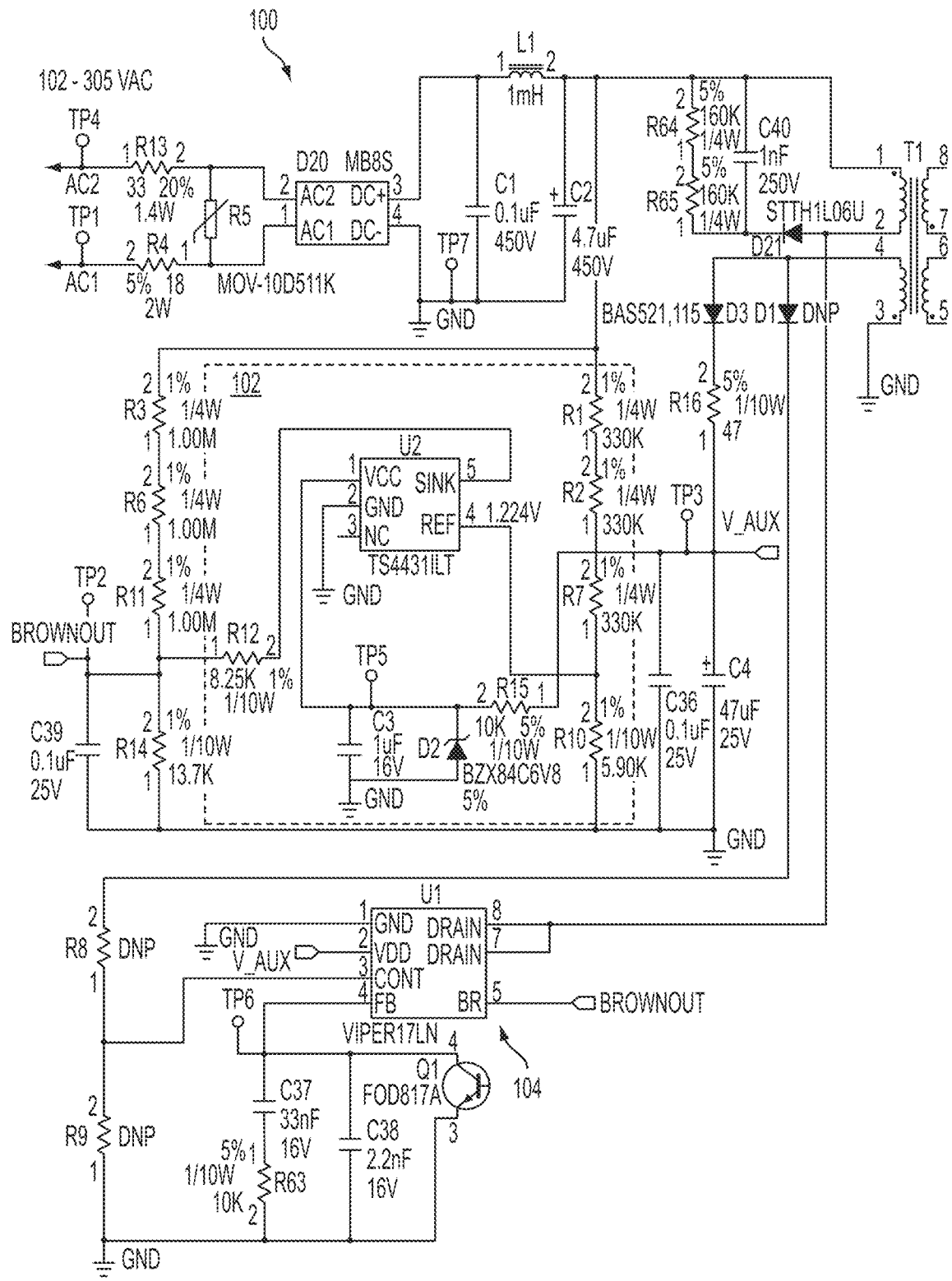
FIG. 1 is a circuit diagram illustrating associated circuitry for brown-out function and AC-DC switch mode controller according to exemplary embodiments of the present application.

Before any embodiments of the application are explained in detail, it is to be understood that the application is not limited in its application to the details of construction and the arrangement of components set forth in the following description or illustrated in the following drawings. The application is capable of other embodiments and of being practiced or of being carried out in various ways.

Because the lamps in emergency lighting units are normally off the majority of the time when AC power is present in the building the reduced energy usage of the LED lamp source does not have a significant impact on energy usage of the emergency lighting unit to the extent that it has in normally on general purpose lighting fixtures. Although the LED does not offer a significant enough reduction in energy usage to justify its use based on an energy usage pay back analysis it does have significant advantages over the traditional incandescent light sources that make it a desirable and superior for emergency lighting unit applications.

The four primary reasons to adopt the LED as a replacement light source over the traditional LED light source are higher luminous efficacy, increased life/reliability, reduction in required battery size and a reduction in the overall size of the emergency lighting unit.

While it can be shown that there are many benefits to an LED based emergency lighting unit, without a payback justification market adoption of the technology would most likely be very slow. To accelerate the market adoption of the LED technology in emergency lighting units there were several problems that had to be overcome to offer an emergency lighting unit at a price point that was equivalent to the traditional emergency lighting unit solutions.

In order to offset the higher cost of the LED light source, exemplary embodiments of the present application provide several design tradeoffs based around the higher efficacy of the LED light source.

An exemplary embodiment of the present application provides a system comprising two 1 W high brightness white LEDs. Based on estimated values of the light output from the LEDs and factoring in efficiency losses for LED heat sinks, optics and the driver it was determined that the LED light sources chosen would be capable of delivering 40% more coverage area along the path of egress while using a battery that had 85% less capacity than the 6V 4 Ah battery used in incandescent based emergency lighting units. This huge reduction in required battery capacity to deliver more light output was a factor in realizing the four primary benefits of the LED source while enabling several features that are desirable for users of emergency lighting units.

According to exemplary embodiments of the present application, because of the reduced battery capacity requirements it was viable to adopt a Nickel Metal Hydride (NiMH) battery over the traditional VRLA battery and still achieve a cost savings that would partially offset the increased cost of the LED source. In an exemplary implementation, this battery eliminates the use of the Restricted and Hazardous Substance (RoHS) "lead" in the product with a much more environmentally friendly power source. The use of the NiMH battery can also enable the use of a battery that has a typical life of 5 years vs. the 3 year life typically offered by VRLA type batteries. The reduced battery size can also enable the use of a much smaller housing size for the emergency lighting unit. According to an exemplary implementation, a reduction in size of the housing can enable the use of less plastic to create the emergency lighting unit again offsetting the cost of the higher cost LED source. Because the LED source could offer 40% more light coverage area, an additional benefit of less units to buy and install can be realized for the customer. Finally because the LED source is used, the unit can offer a light source that can last the lifetime of the unit instead of a typical 50 hour lamp life that is traditionally realized for DC incandescent lamps. This increased lamp life can further reduce maintenance required to keep the unit operating properly over its lifetime.

According to further exemplary embodiments of the present application, because an LED light source and a lower capacity NiMH battery were chosen as the key design elements for this application a change in the battery charging and transfer circuitry was required. These changes took advantage of the benefits that the LED source offered to provide several novel benefits to the customer while solving problems associated with the new circuit topology.

According to an exemplary implementation of the present application, a reduction in battery size can be achieved by a reduction in the required nominal battery voltage and nominal battery capacity.

Conventional emergency lighting units as described above have typically relied on a VRLA 6V battery as the emergency power source for 6V incandescent lamps. It was a relatively easy process to design a circuit that detected the loss of AC power to the emergency lighting unit and utilized a relay to connect the battery to the lamps when a loss of AC power was detected. Because the battery voltage needed to be reduced to 2.4V for this design to maintain the required reduction in cost a simple design of this nature was not possible for this unit. Further complicating the design process was the fact that the 2.4V battery voltage would need to be boosted to a level sufficient to power the two LEDs in series while regulating the current through the series connected LED string. While many commercially available DC-DC switch-mode controller integrated circuits (ICs) exist in the market very few are designed to work from a 2.4V nominal voltage source. Of those few commercially available sources for DC-DC controller ICs that were capable of meeting the design requirements none could do so at a cost that would be practical to achieve price parody with the conventional emergency lighting solution.

To address the above-noted problem at a price point viable for the design, an exemplary embodiment of the present application implements a general purpose microcontroller. While the microcontroller can be more expensive than many dedicated DC-DC controller ICs, it offered many advantages. Because of the general purpose nature of the microcontroller the DC-DC controller requirements could be integrated into one device that would not only fulfill those requirements but would also offer the functionality required to provide AC line loss detection, charger control and the ability to monitor the battery, lamps and LED driver associated with the design. Because microcontrollers are often used in low power battery applications it was also easier to find a commercially available device that would operate from the nominal 2.4V battery source.

An additional benefit of using the microcontroller according to exemplary embodiments of the present application includes an implementation of a more sophisticated charging technique, according to yet another exemplary embodiment of the present application, than is typically employed in traditional emergency lighting units. According to exemplary implementations of the present application, a microcontroller can provide timing periods function and monitoring of battery charge voltage and current. Using these capabilities the design of the battery charger according to exemplary embodiments of the present application can provide a quick bulk charge mode to quickly recharge the battery after a discharge while also providing a maintenance charge that significantly lowered (ten times less) maintenance mode power requirements for the charger. The lower maintenance charge mode also provides the additional benefit of extending battery life by only charging the battery when it is required reducing the amount of wear on the battery.

FIGS. 1 through 5F illustrate exemplary implementations of circuit components forming at least a portion of LED-based emergency lighting system or equipment according to an exemplary embodiment of the present application as follows.

FIG. 1 is an illustrative example of a primary side flyback converter circuitry according to an exemplary embodiment of the present application, including AC-DC conversion and primary and auxiliary flyback circuits 100, two level brown-out detection circuit 102, and flyback controller circuits 104.

Figure 2:
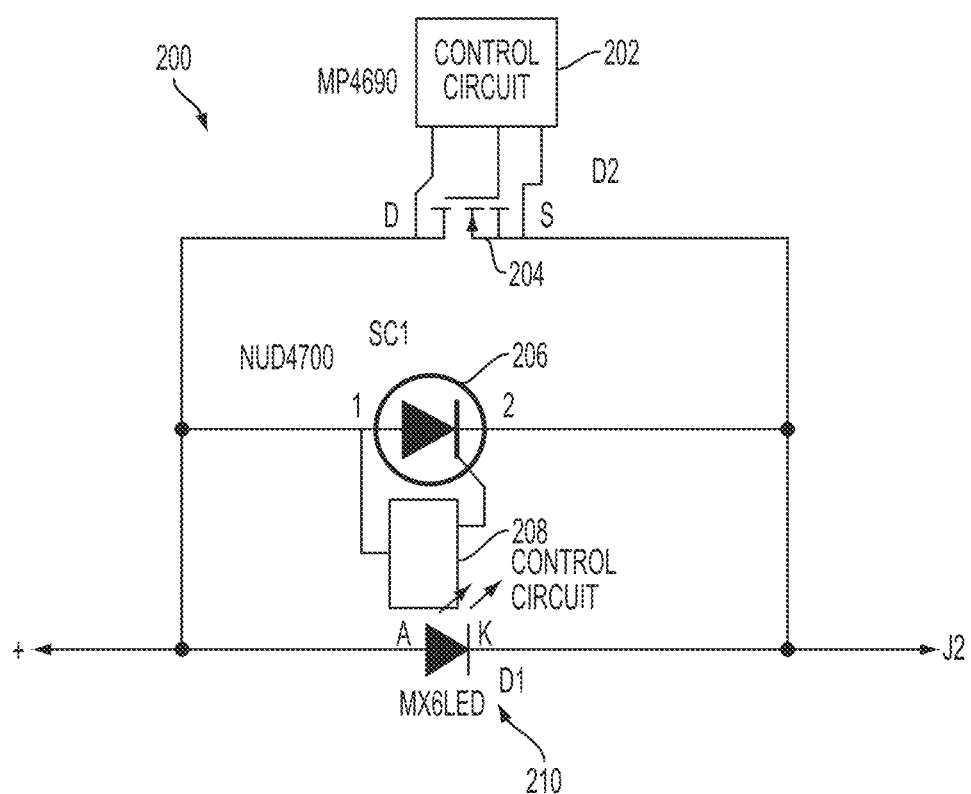
FIG. 2 is a circuit diagram illustrating an exemplary LED unit that can be employed in emergency lighting according to exemplary embodiments of the present application.

FIG. 2 is an illustrative example of a LED lamp circuit (one for each lamp provided) 200 according to an exemplary embodiment of the present application. According to an exemplary implementation, "NUD4700" component (which includes elements 206 and 208) and "MP4690" component (which includes elements 202 and 204) are not both used to build the lamp. Only one of the two devices needs to be populated to provide open circuit failure protection for the series connected LEDs, such as "MX6LED" 210.

Figure 3:
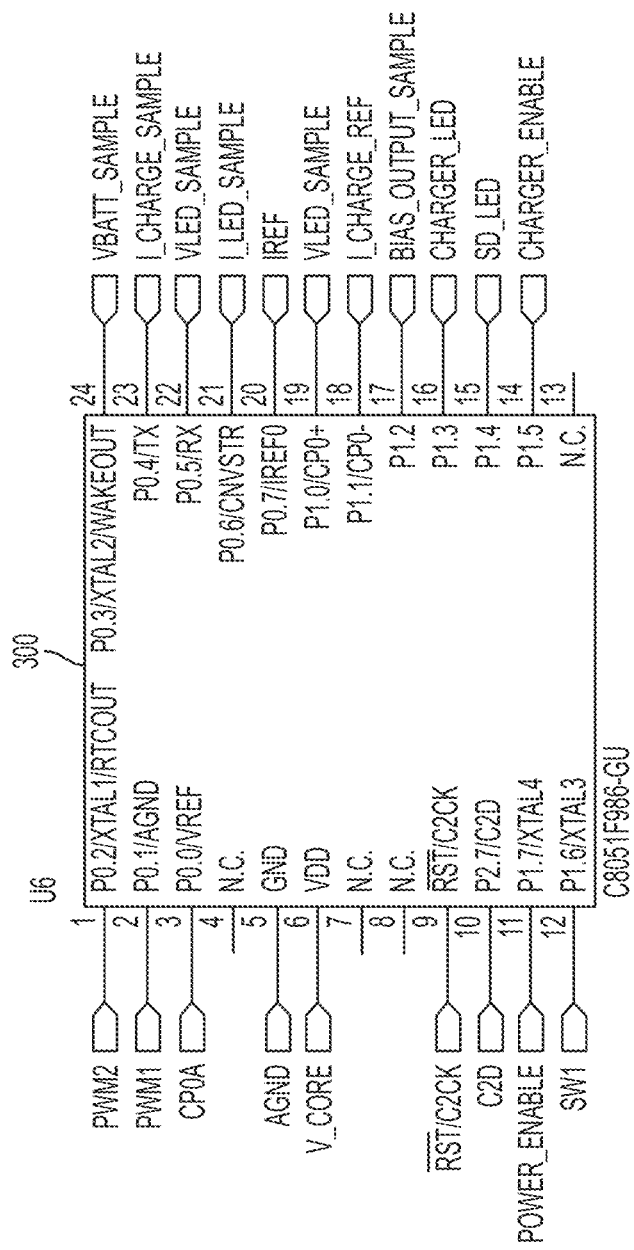
FIG. 3 is a block I/O diagram illustrating an exemplary implementation of a microprocessor for controlling emergency lighting according to exemplary embodiments of the present application.

FIG. 3 is an illustrative example of a unit micro-controller 300 according to an exemplary embodiment of the present application.

Figure 4A:
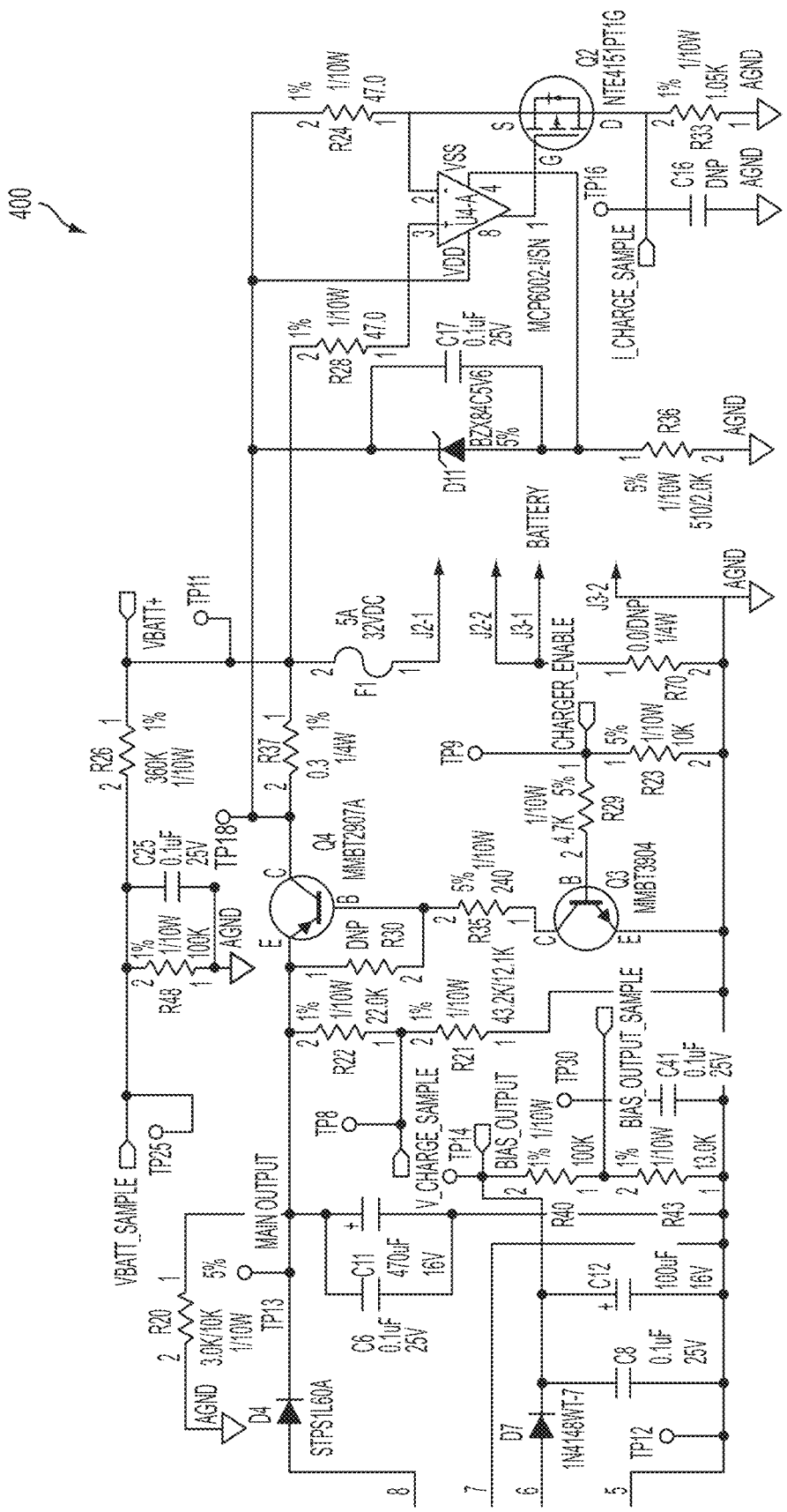
FIGS. 4A-4C are circuit diagrams illustrating additional components of LED-based emergency lighting according to exemplary embodiments of the present application.

FIG. 4a is an illustrative example of charger control and monitoring circuits 400 according to an exemplary embodiment of the present application associated with circuitry illustrated in FIG. 1 as shown by the block diagram.

Figure 4B:
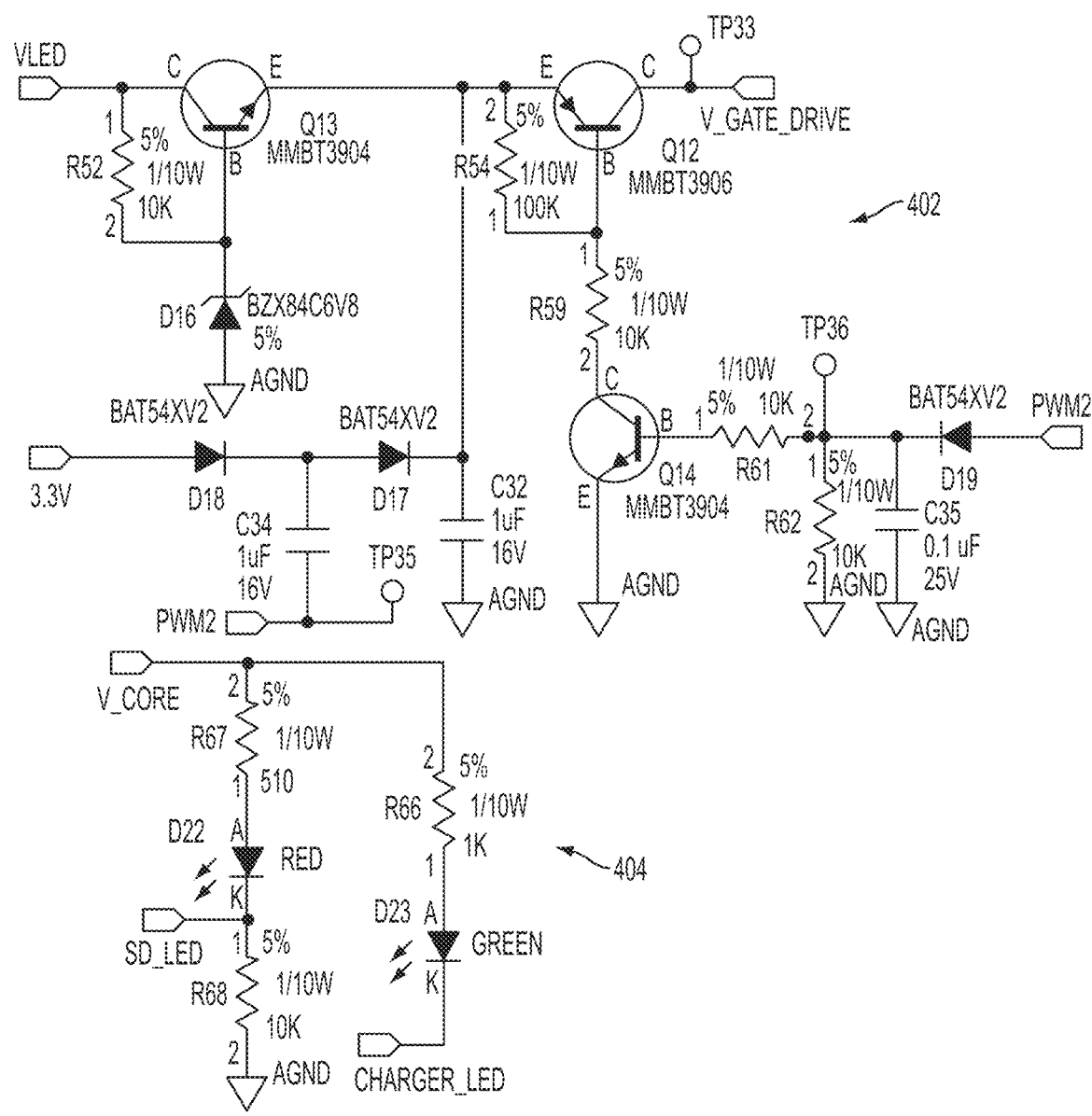
Figure 4C:
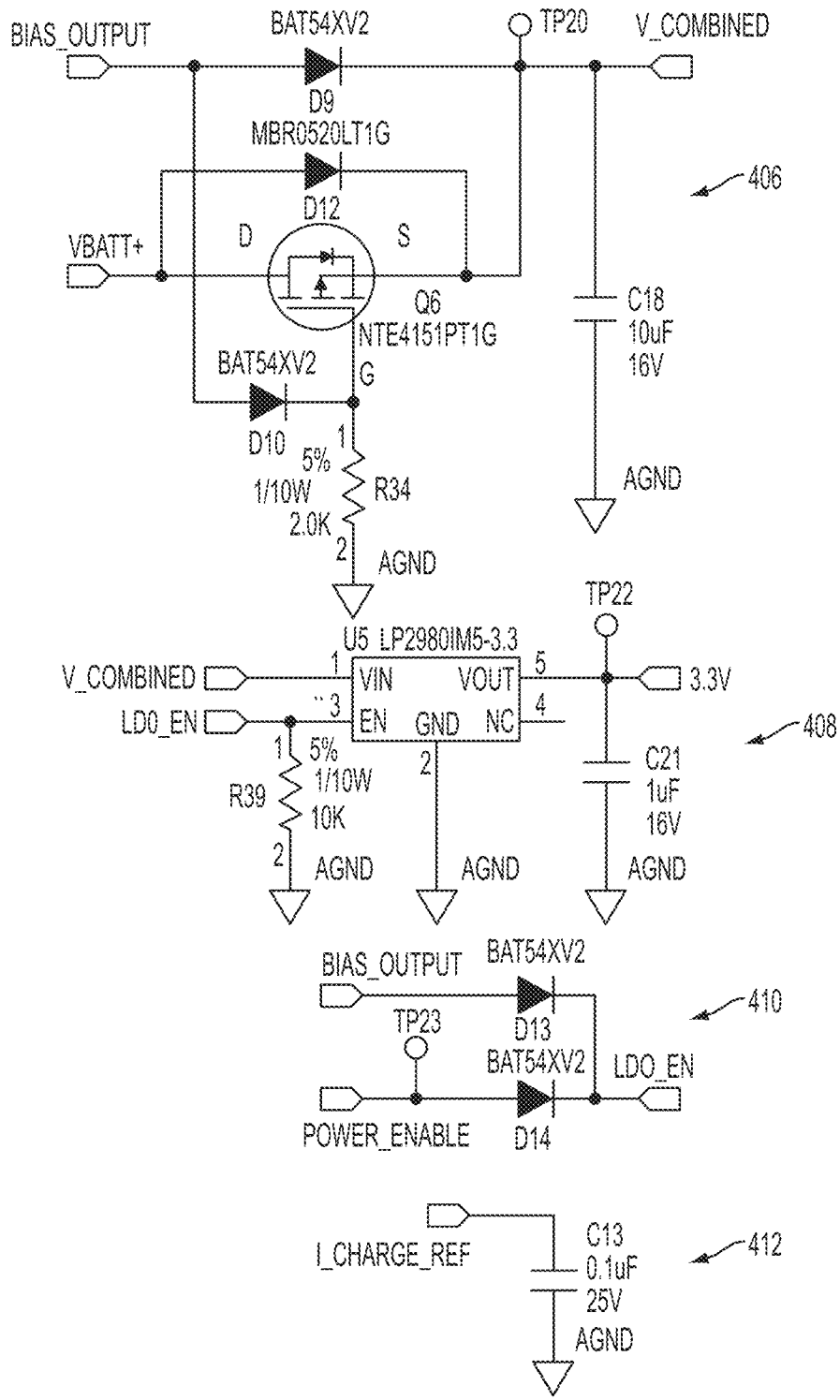

FIG. 4B is an illustrative example of DC-DC drive and LED status indicators according to an exemplary embodiment of the present application, including DC-DC gate drive circuits 402 and status LED circuits 404. FIG. 4C is an illustrative example of power and reference voltage circuits according to an exemplary embodiment of the present application, including Vbatt+ and bias output "OR" circuits 406, 3.3V LDO regulator circuit 408, bias output and power enable diode "OR" circuit 410, and I charge reference filter circuit 412.

Figure 5A:
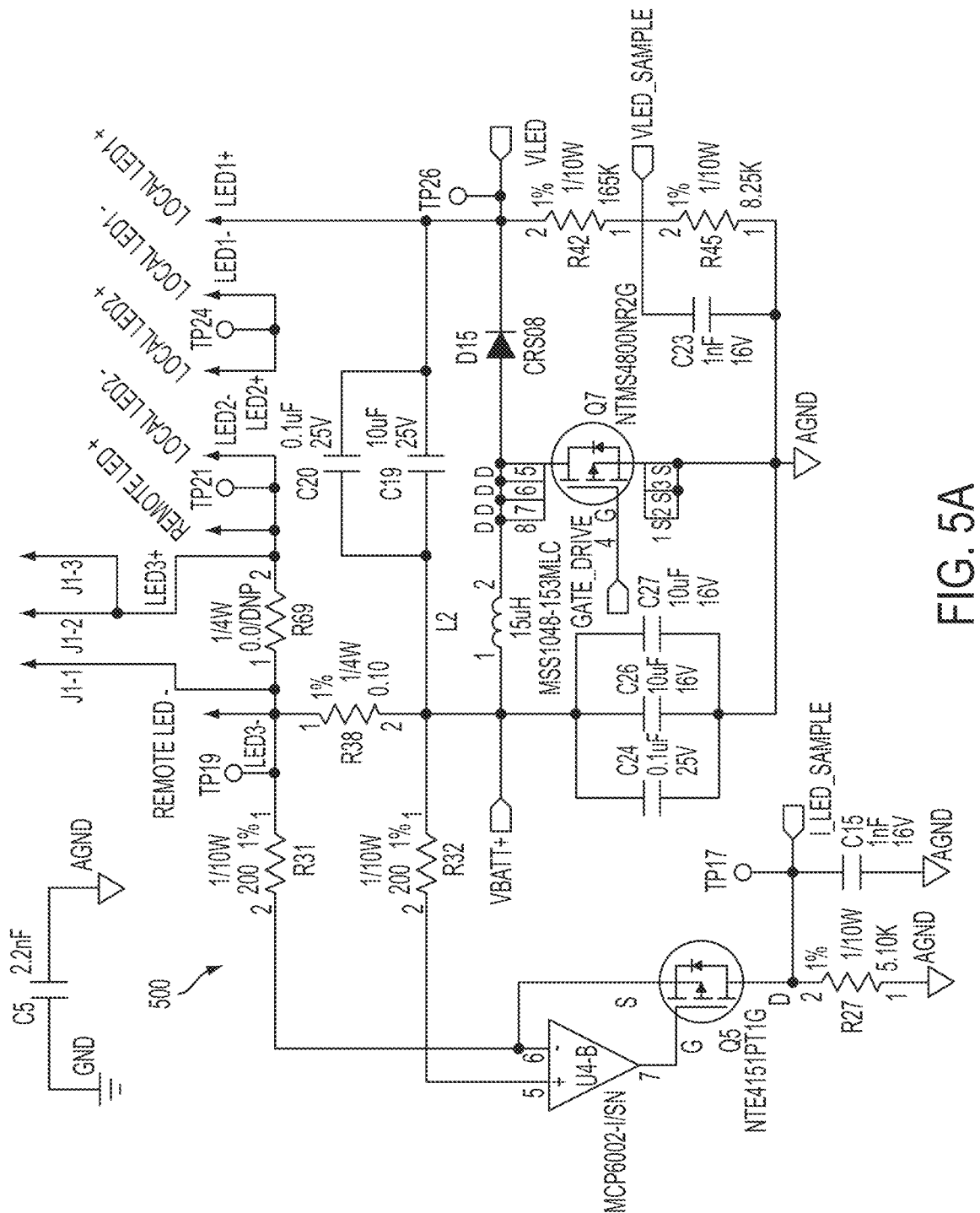
FIGS. 5A-5F are circuit diagrams illustrating additional components of LED-based emergency lighting according to exemplary embodiments of the present application.
Figure 5B:
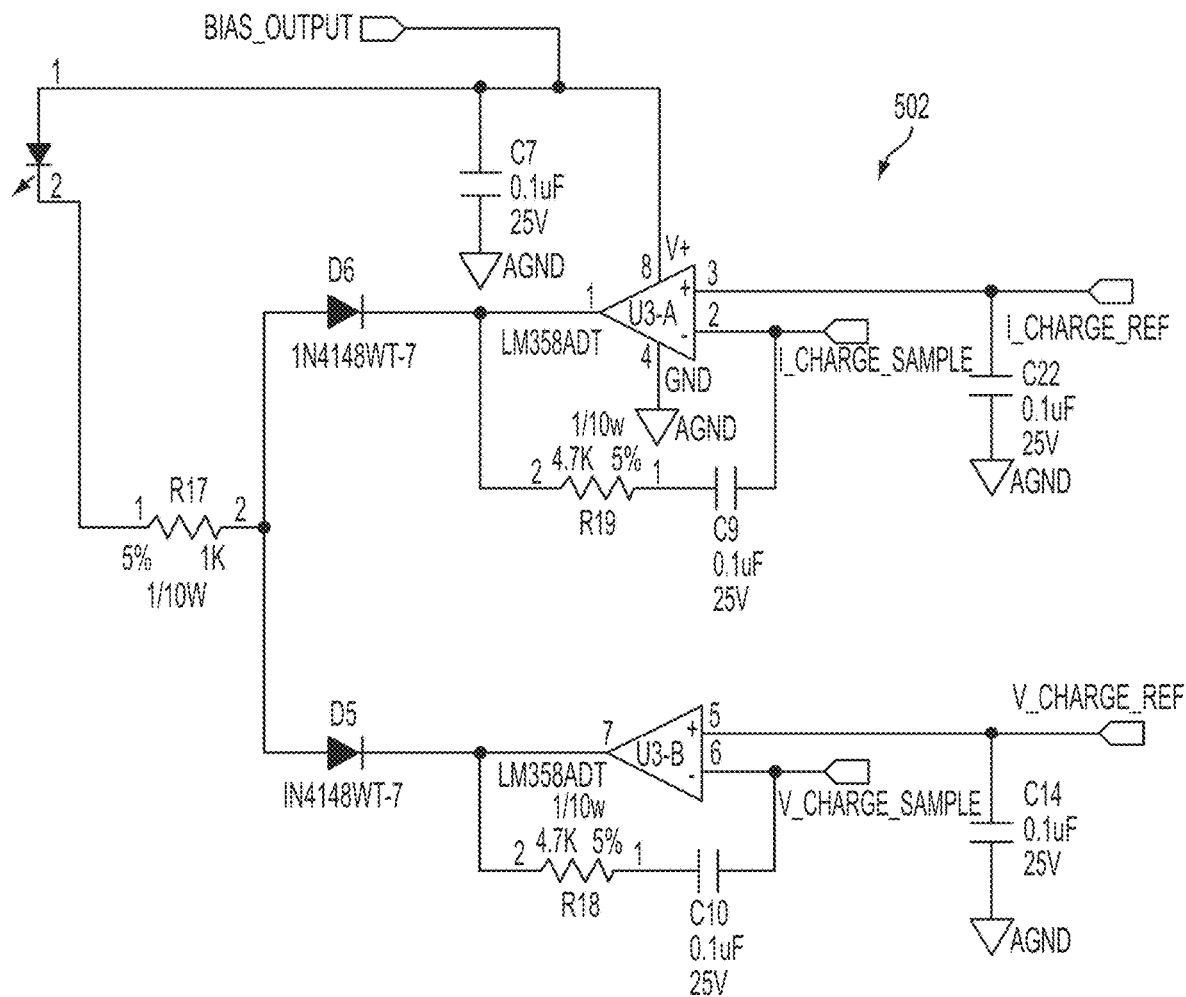

FIG. 5A is an illustrative example of DC-DC conversion and monitoring circuits 500 according to an exemplary embodiment of the present application. FIG. 5B is an illustrative example of charger voltage and current control circuits 502 according to an exemplary embodiment of the present application associated with circuitry illustrated in FIGS. 1 and 4A as shown by the block diagram.

Figure 5C:
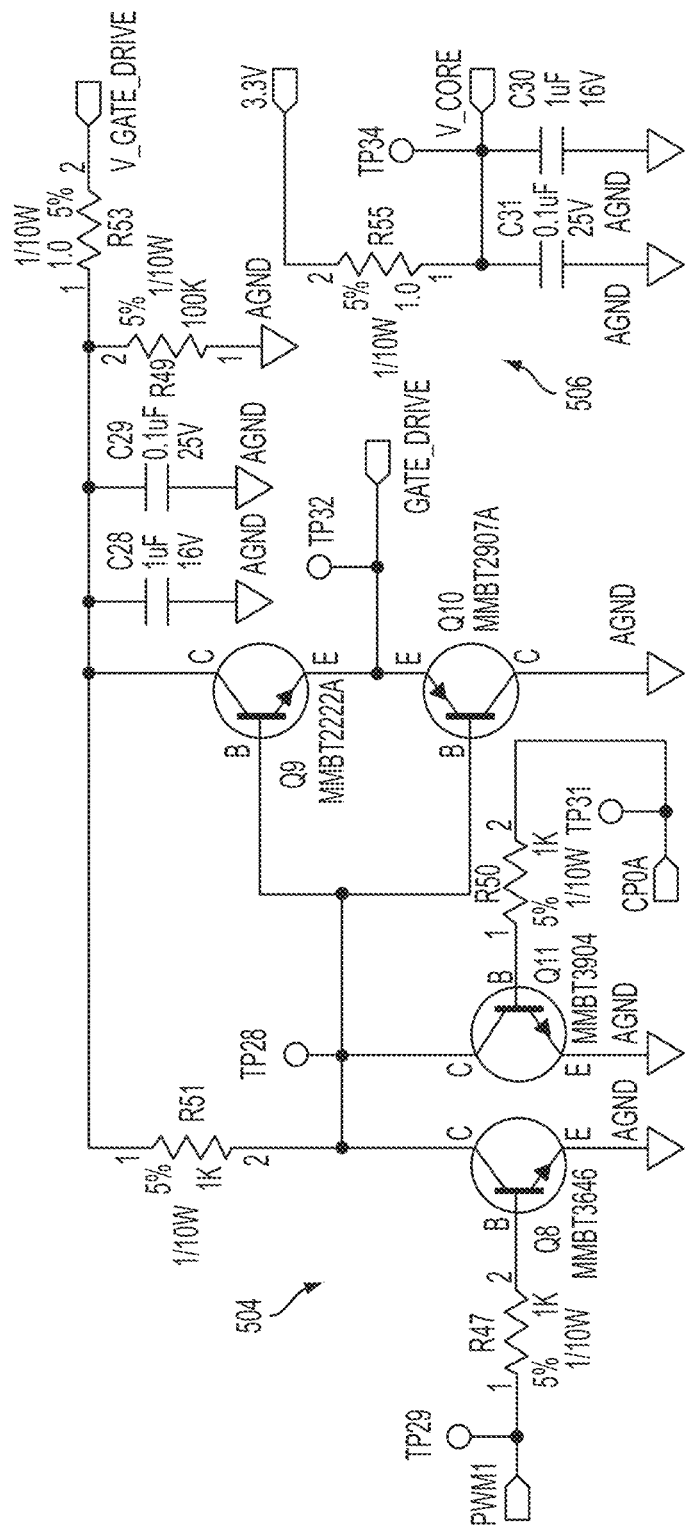
Figure 5D:
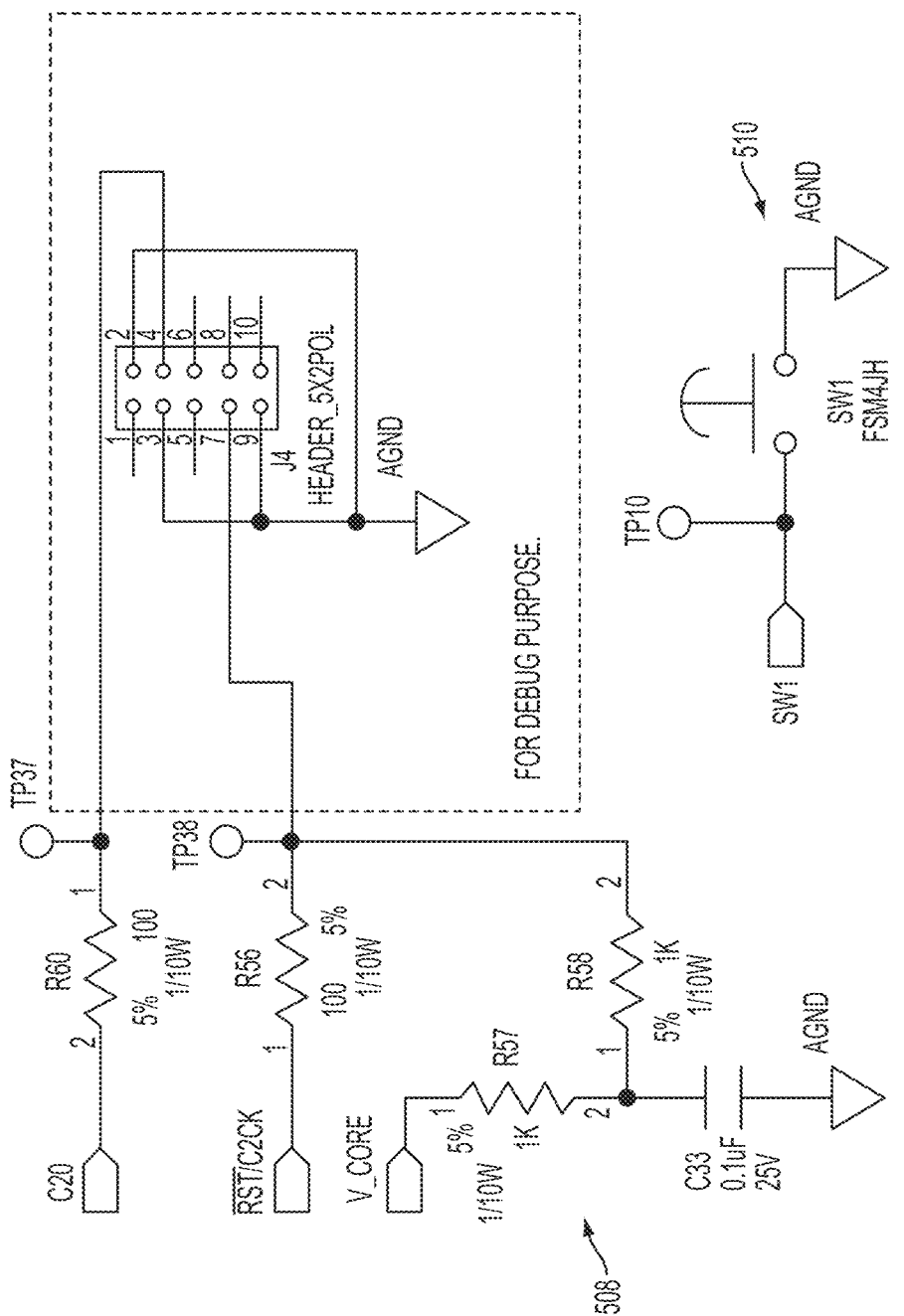
Figure 5E:
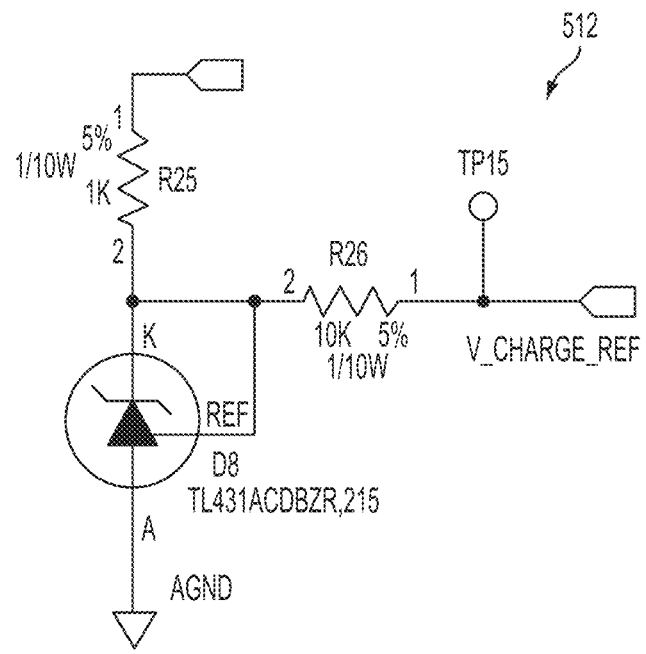
Figure 5F:
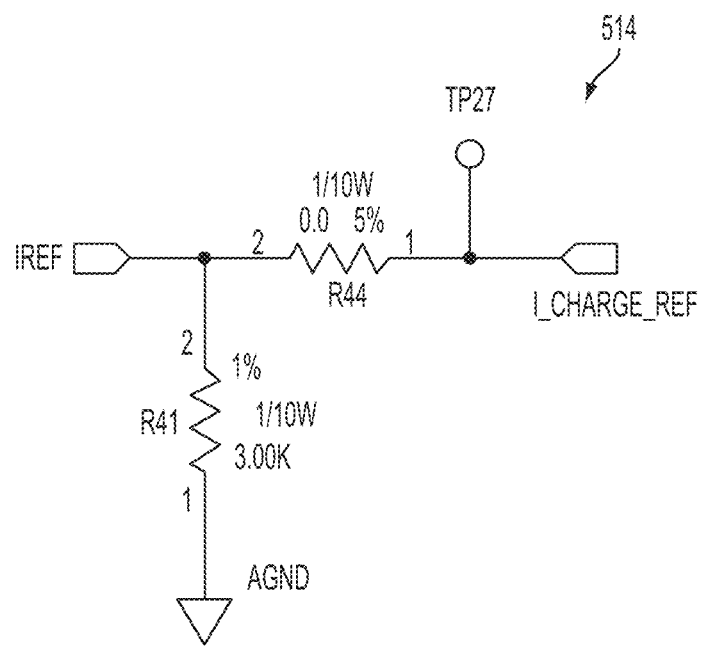

FIG. 5C is an illustrative example of DC-DC drive and 3.3V regulator circuits according to an exemplary embodiment of the present application, including DC-DC drive circuits 504 and 3.3V regulator filter circuit 506. FIG. 5D is an illustrative example of reset, device programming and test switch circuits according to an exemplary embodiment of the present application, including reset and device programming circuits 508 and unit test switch circuit 510. FIG. 5E is an illustrative example of a charger reference voltage circuit 512 according to an exemplary embodiment of the present application. FIG. 5F is an illustrative example of a charger reference current circuit 514 according to an exemplary embodiment of the present application FIGS. 6 through 15 illustrate through the use of system state machine diagrams and flow charts exemplary implementations of LED-based emergency lighting methodology or processes according to exemplary embodiments of the present application as follows.

Figure 6:
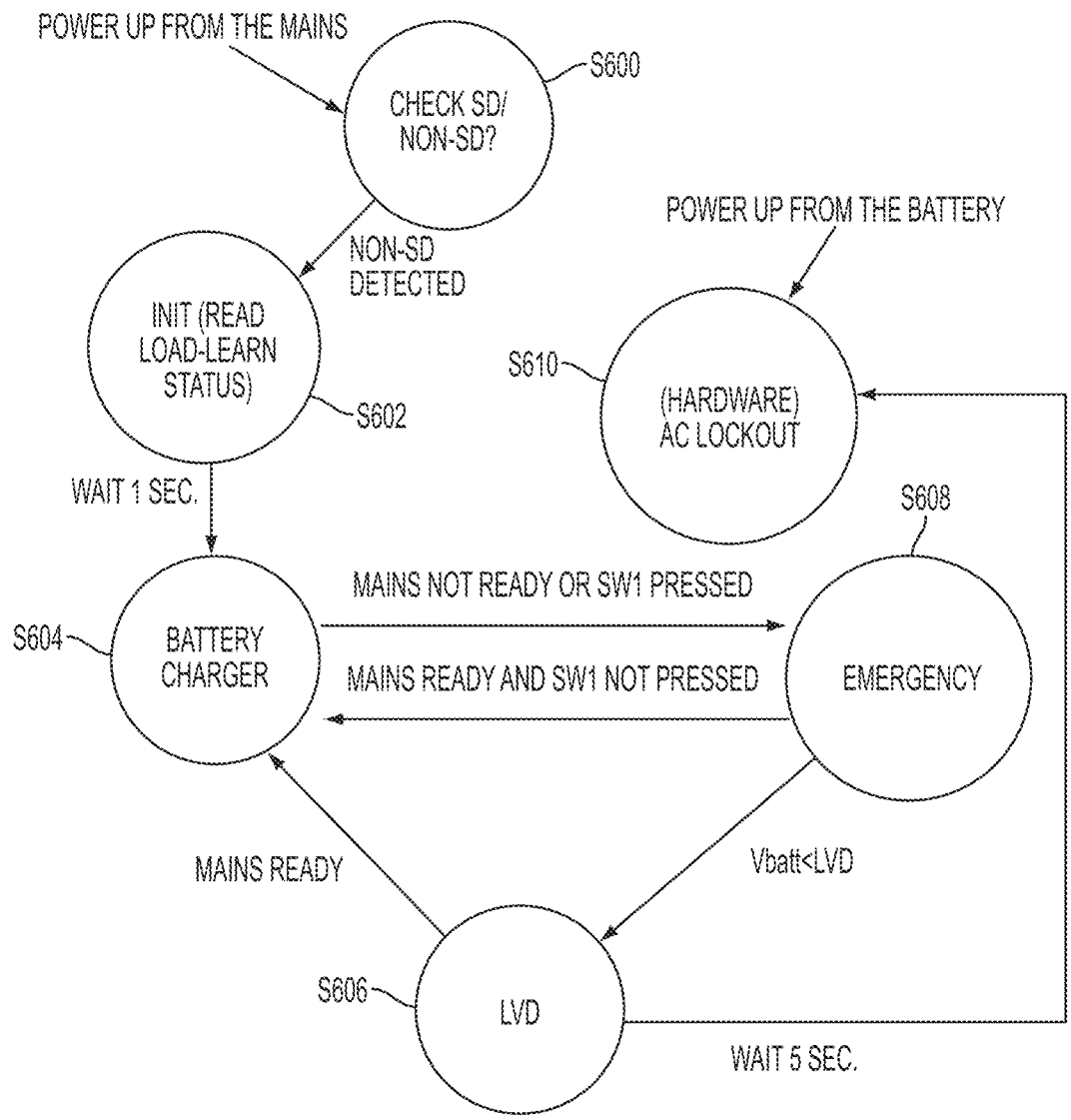
FIG. 6 is a state machine diagram of an exemplary unit system substate machine for LED based emergency lighting equipment according to an exemplary embodiment of the present application.
Figure 7:
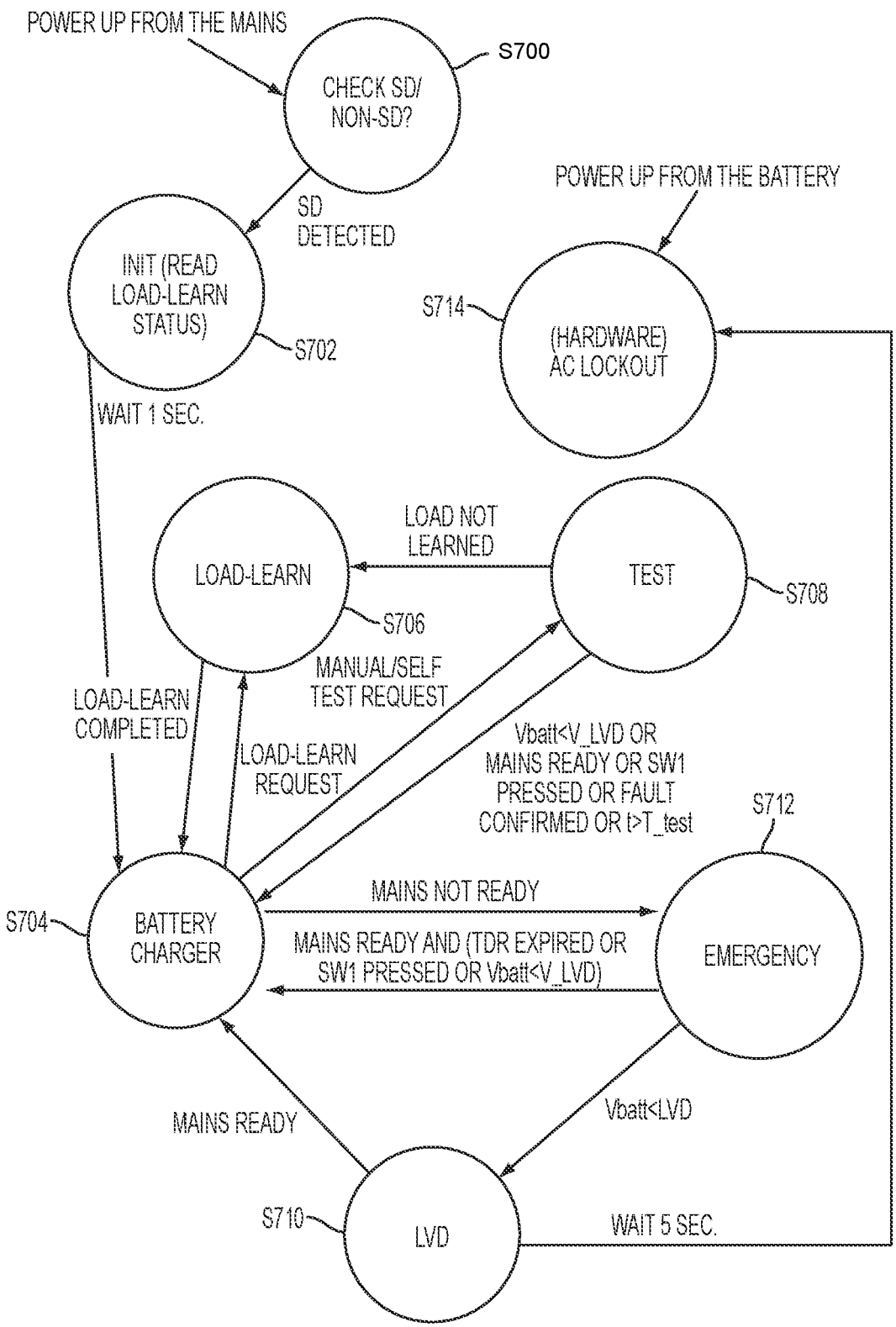
FIG. 7 is a state machine diagram of another exemplary unit system substate machine for LED based emergency lighting equipment according to another exemplary embodiment of the present application.

FIG. 6 is an illustrative example of a unit system state machine which includes process flow and functionality as defined by the annotated states S600 through S610. FIG. 7 is an illustrative example of another unit system state machine which includes process flow and functionality as defined by the annotated states S700 through S714, where states S700, S702, S704, S710, S712, S714 parallel states S600, S602, S604, S606, S608, S610, respectively, and further provide for a self-diagnostics capability as shown by states S706, S708.

According to exemplary embodiments of the present application, several charging techniques can be implemented including, but not limited to: (1) based on fixed bulk charge and trickle charge time interval to determine an end-of-charge status, and (2) based on delta V/delta t<=0 and a safety timer to determine an end-of-charge.

Figure 8:
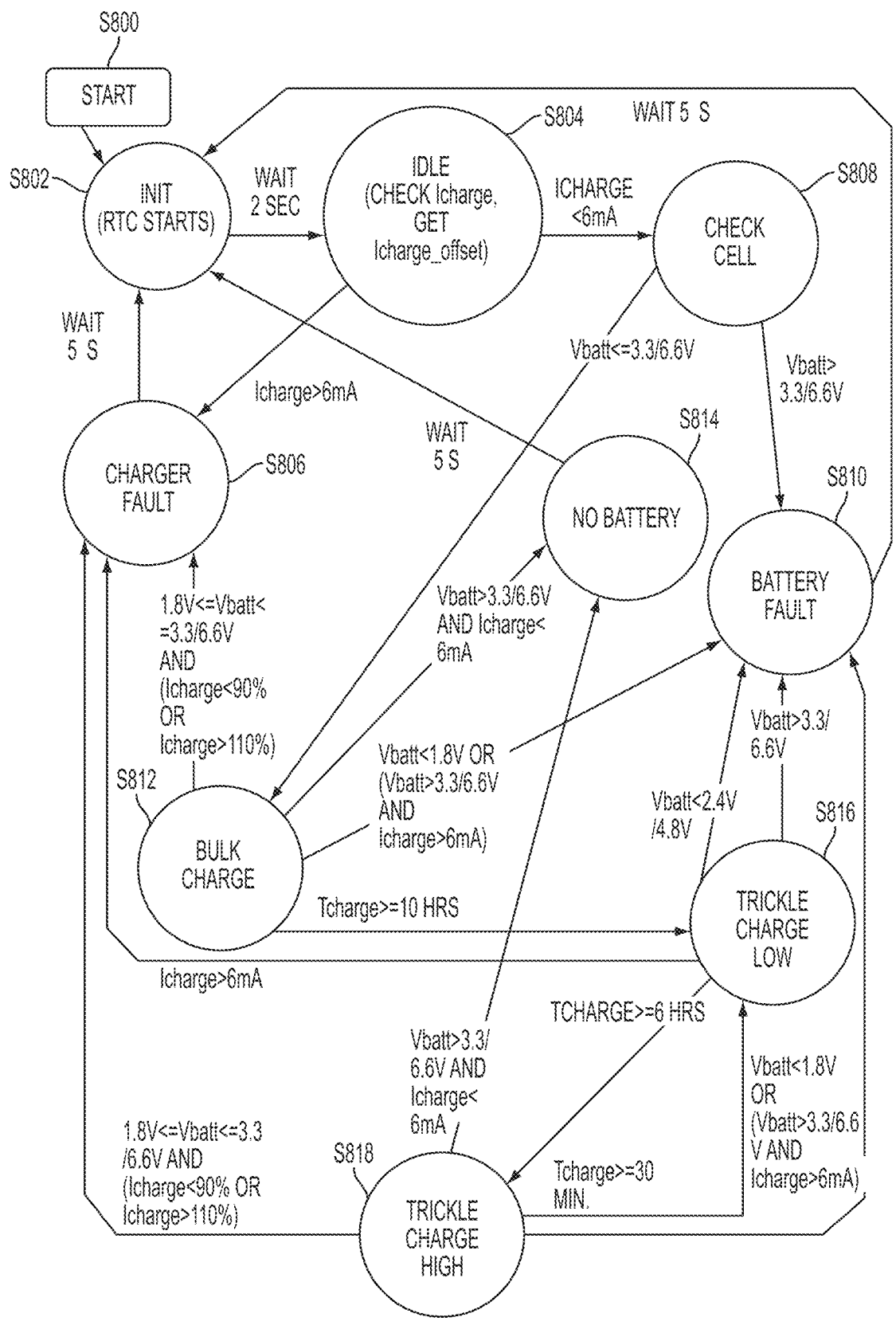
FIG. 8 is a state machine diagram of an exemplary battery charge substate machine for LED based emergency lighting equipment according to an exemplary embodiment of the present application

Referring to the state diagram of FIG. 8, in an exemplary implementation, charge method (1) is executed as follows:

The charger algorithm starts (S800) from Initialize state (S802) during which it disables the charger, resets the battery status to not fully charged, and resets all the time in fault condition counters. Then it waits, for example 2 seconds, for stabilization and shifts to Idle state (S804).

In Idle state, it first checks charge current and shifts to Charger Fault state (S806) if the charge current is greater than a current threshold value (for example, 6 mA) for over, for example, a second. In Charger Fault state, it will wait, for example 5 seconds, and shifts back to Initialize state (S802) and start over. If the charge current is less than or equal to the current threshold value, then it samples the charge current amplifier output offset and stores it for future calculation. Then it shifts to Check Cell state (S808).

In Check Cell state, it samples the battery voltage. If the battery voltage is higher than voltage threshold value (for example, 3.3V for 2-cell configuration or 6.6V for 4-cell configuration) for over, for example, a second, then it shifts to Battery Fault state (S810). In Battery Fault state, it will wait, for example 5 seconds, and shifts back to Initialize state and start over. If the battery voltage is not too high (for example, less than or equal to the voltage threshold value), then it shifts to Bulk Charge state (S812).

In Bulk Charge state, it sets the charge current to a bulk charge value (for example, 200 mA) and enables the charger. Then it checks the battery voltage. If the battery voltage is lower than a low voltage threshold value (for example 1.8V) for, for example, over 10 ms, then it disables the charger and shifts to Battery Fault state (S810). In Battery Fault state, it will wait 5 seconds and shifts back to Initialize state and start over.

Then, continuing in Bulk Charge state, it checks both the battery voltage and charge current. If the battery voltage is higher than the voltage threshold value and there is no charge current (for example, the charge current is less than 6 mA) for over, for example, a second, then it is considered that there is no battery connected. So it shifts to No Battery state (S814). In No Battery state, it will wait, for example 5 seconds, and shift back to Initialize state (S802) and start over.

If there is a battery connected, then it checks if the battery voltage is too high as an indication of battery determination. If the battery voltage is higher than voltage threshold value (for example, 3.3V for 2-cell configuration or 6.6V for 4-cell configuration) and the charge current is greater than a current threshold value (for example, 6 mA) for over, for example, a second, then it shifts to Battery Fault state. In Battery Fault state, it will wait 5 seconds and shifts back to Initialize state and start over.

Continuing further in Bulk Charge state, if the battery voltage is within the normal range, then it checks charge current. If the charge current is outside +/-10% of 200 mA for over a second, then it shifts to Charger Fault state. In Charger Fault state, it will wait 5 seconds and shifts back to Initialize state and start over.

If the battery voltage and the charge current are within the normal range, then it checks if the bulk charge time is over, for example, 10 hours. It stays in Bulk Charge state and check the above-mentioned battery voltage, charge current and charge time parameters, for example every 1 ms, until the bulk charge time is expired. It then shifts to Trickle Charge Low state (S816).

In Trickle Charge Low state, it first disables the charger. Then it checks the battery voltage. If the battery voltage is lower than, for example, a trickle charge threshold value (for example, 2.4V for 2-cell configuration or 4.8V for 4-cell configuration) for over a second, then it shifts to Battery Fault state. In Battery Fault state, it will wait 5 seconds and shifts back to Initialize state and start over.

According to an exemplary embodiment, trickle charge threshold value can be proportional to a number of cells of the rechargeable battery, such that, for example, the trickle charge threshold value can be calculated to be about 1.2V multiplied by N, where N is equal to a number of cells of the rechargeable battery.

If the battery voltage is higher than voltage threshold value (for example, 3.3V for 2-cell configuration or 6.6V for 4-cell configuration) for over, for example, a second, then it shifts to Battery Fault state. In Battery Fault state, it will wait 5 seconds and shifts back to Initialize state and start over.

According to an exemplary embodiment, voltage threshold value can be proportional to a number of cells of the rechargeable battery, such that, for example, the threshold value can be calculated to be about 1.65V multiplied by N, where N is equal to a number of cells of the rechargeable battery.

Continuing in Trickle Charge Low state, it checks the charge current. If the charge current is greater than a current threshold value (for example, 6 mA) for over, for example, a second, then it shifts to Charger Fault state. In Charger Fault state, it will wait 5 seconds and shifts back to Initialize state and start over. If the charge current is less than or equal to the current threshold value, then it checks if the trickle charge low time is over 6 hours. It stays in Trickle Charge Low state and check the above-mentioned parameters every 1ms until the trickle charge low time is expired. It then shifts to Trickle Charge High state (S818).

In Trickle Charge High state, essentially the same functions as in Bulk Charge state are performed, except that the trickle charge high expiration time is 30 minutes. After it expires, it shifts to Trickle Charge Low state.

If there is an emergency event during which the AC is lost, the system state machine will shift to emergency state and when the AC is restored, the state machine will reset the battery charger state machine and the charger starts from Initialize state again.

In an exemplary implementation, charge method (2) is executed in a similar manner to charge method (1). The main differences are as follows.

In Bulk Charge state, it starts to check delta V/delta t after the bulk charge starts for over 5 minutes. It checks the battery voltage increments and stores the peak and calculates delta V/delta t continuously. If a delta V/delta t<=0 condition is met for a continuous 90 minutes, then it shifts to Trickle Charge Low state. A secondary method of determination of end-of-charge is realized by a safety timer set for 12 hours. If the previously described delta V/delta t<=0 condition is never met for over 12 hours, then it also shifts to Trickle Charge Low state.

The other difference is that, during Trickle Charge High state, the charge current is set to 100 mA, and the duration of Trickle Charge High state is 1 minutes. The duration of Trickle Charge Low state is 5 minutes.

Figure 9:
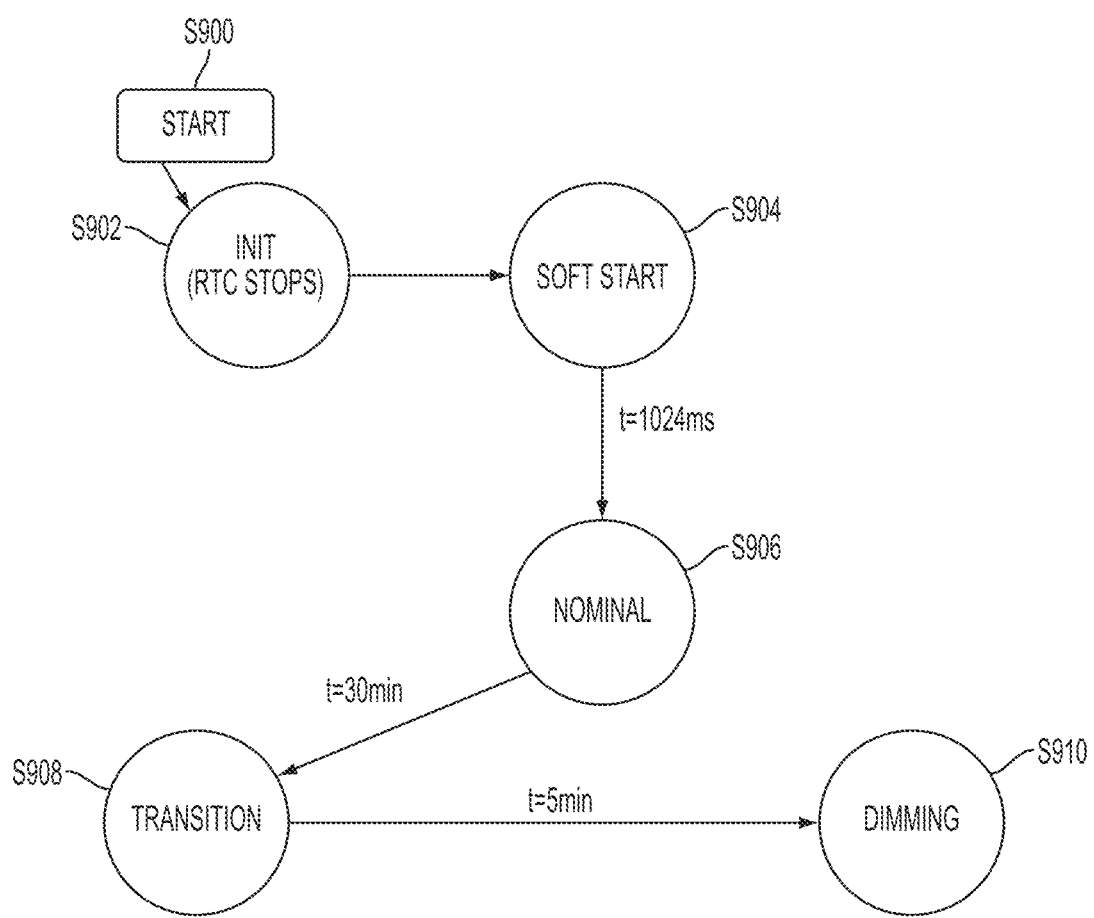
FIG. 9 is a state machine diagram of an exemplary LED driver substate machine for LED based emergency lighting equipment according to an exemplary embodiment of the present application.
Figure 10:
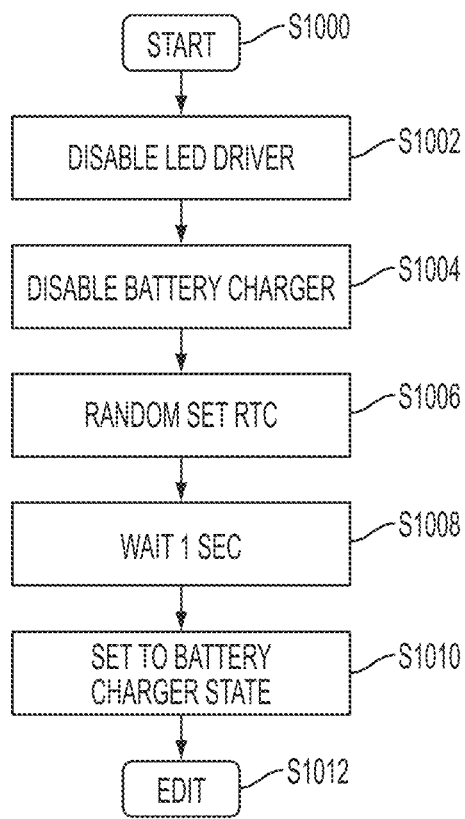
FIG. 10 is a process flow diagram illustrating an exemplary initialization state for LED based emergency lighting equipment according to an exemplary embodiment of the present application.
Figure 11A:
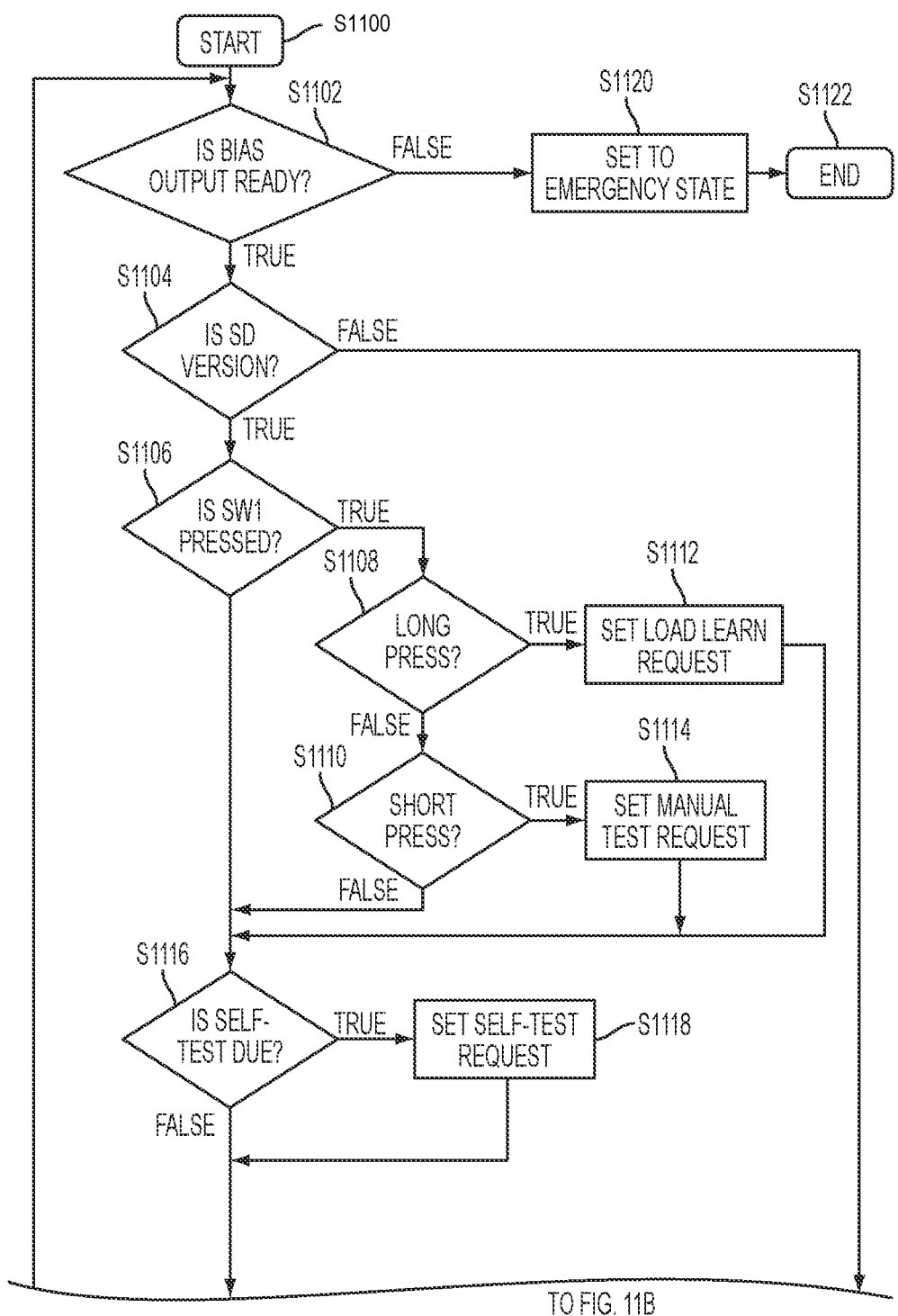
FIGS. 11A and 11B are process flow diagram illustrating an exemplary test/load-learn state for LED based emergency lighting equipment according to an exemplary embodiment of the present application.
Figure 11B:
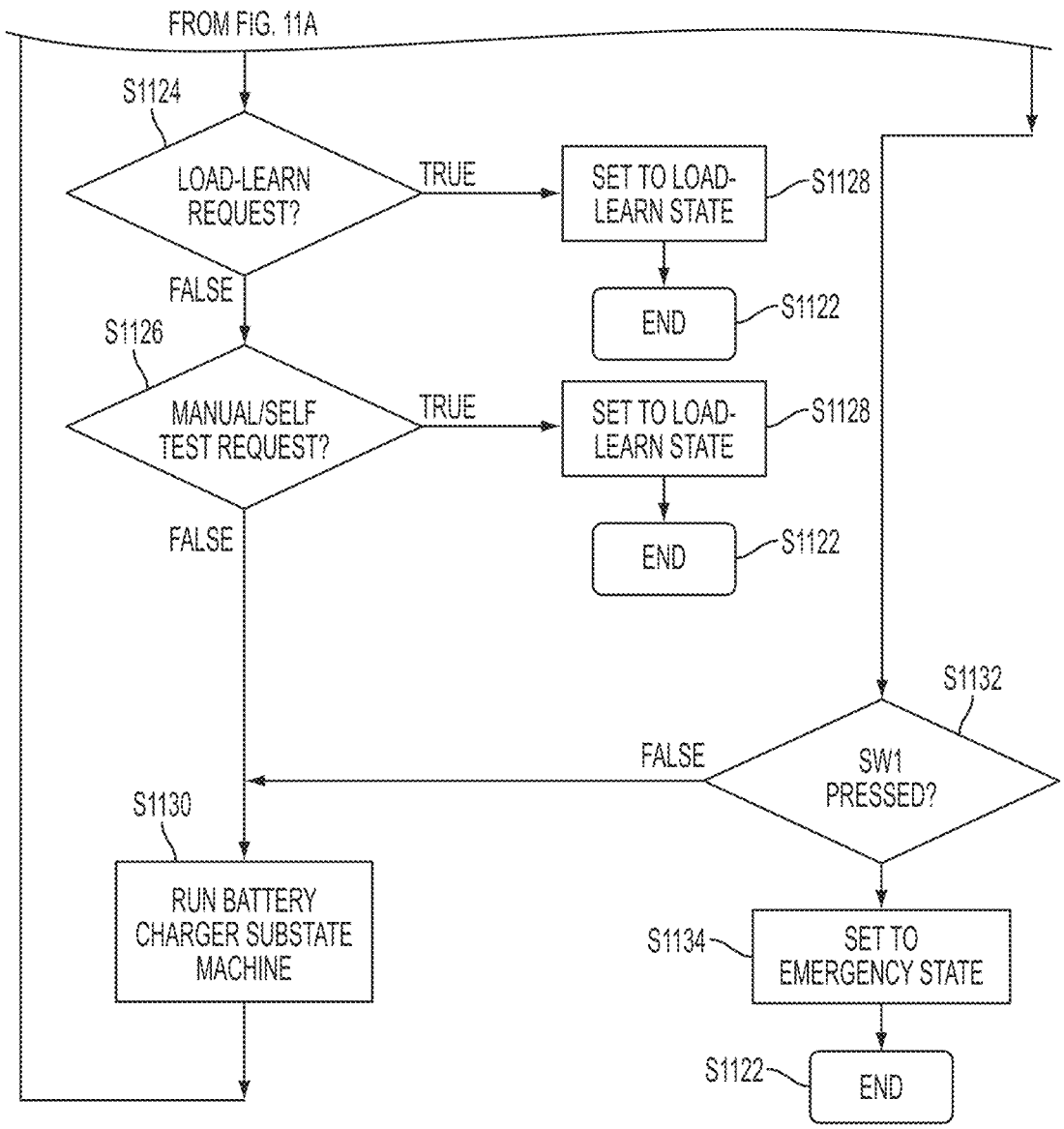

FIG. 9 is an illustrative example of LED driver substate machine which includes process flow and functionality as defined by the annotated states S900 through S910. FIG. 10 is an illustrative example of an initialization state which includes process flow and functionality as defined by the annotated states S1000 through S1012. FIGS. 11A and 11B provide an illustrative example of a battery charger state which includes process flow and functionality as defined by the annotated states S1100 through S1134.

Figure 12:
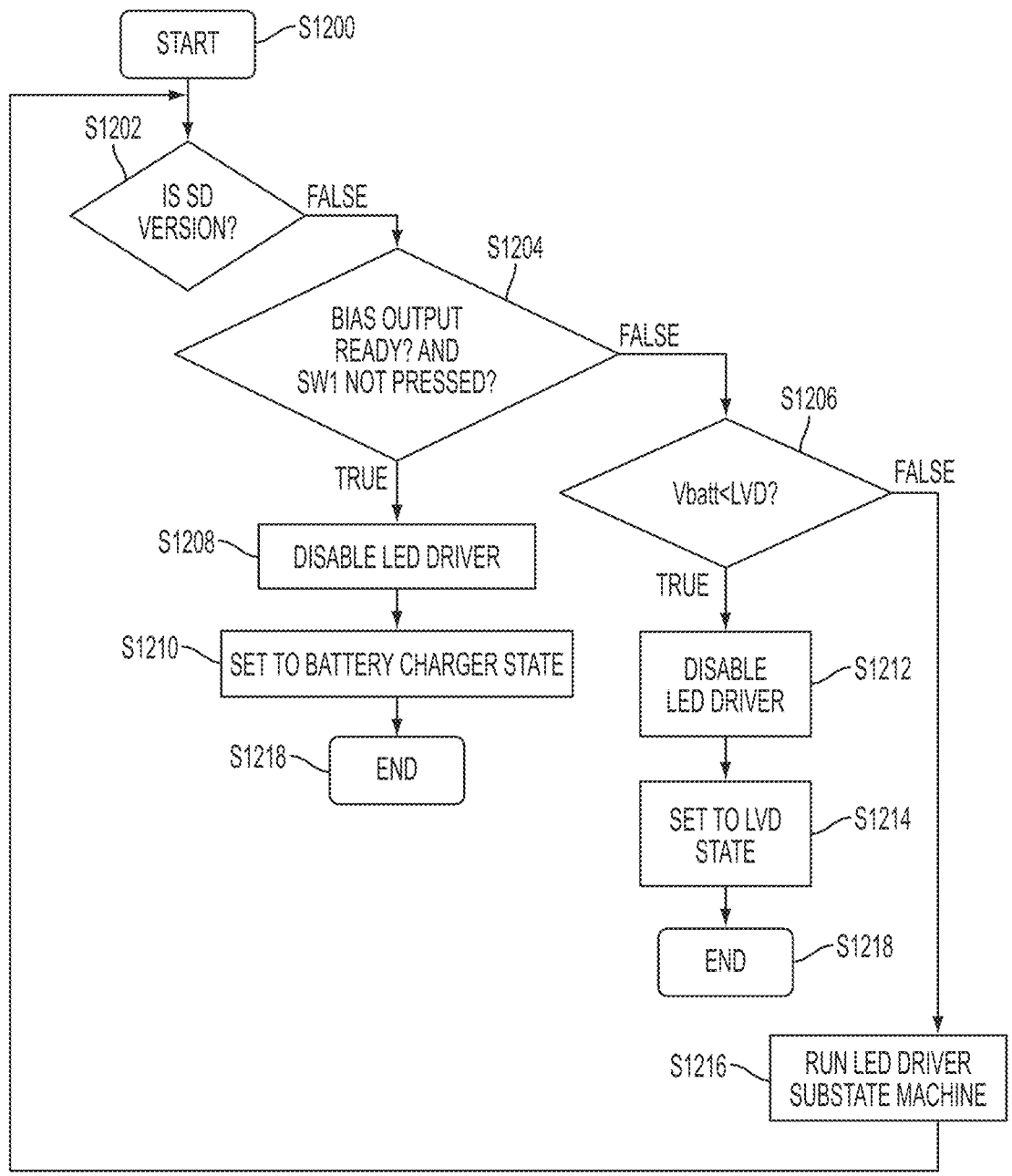
FIG. 12 is a process flow diagram illustrating an exemplary emergency state for LED based emergency lighting equipment according to an exemplary embodiment of the present application.
Figure 13:
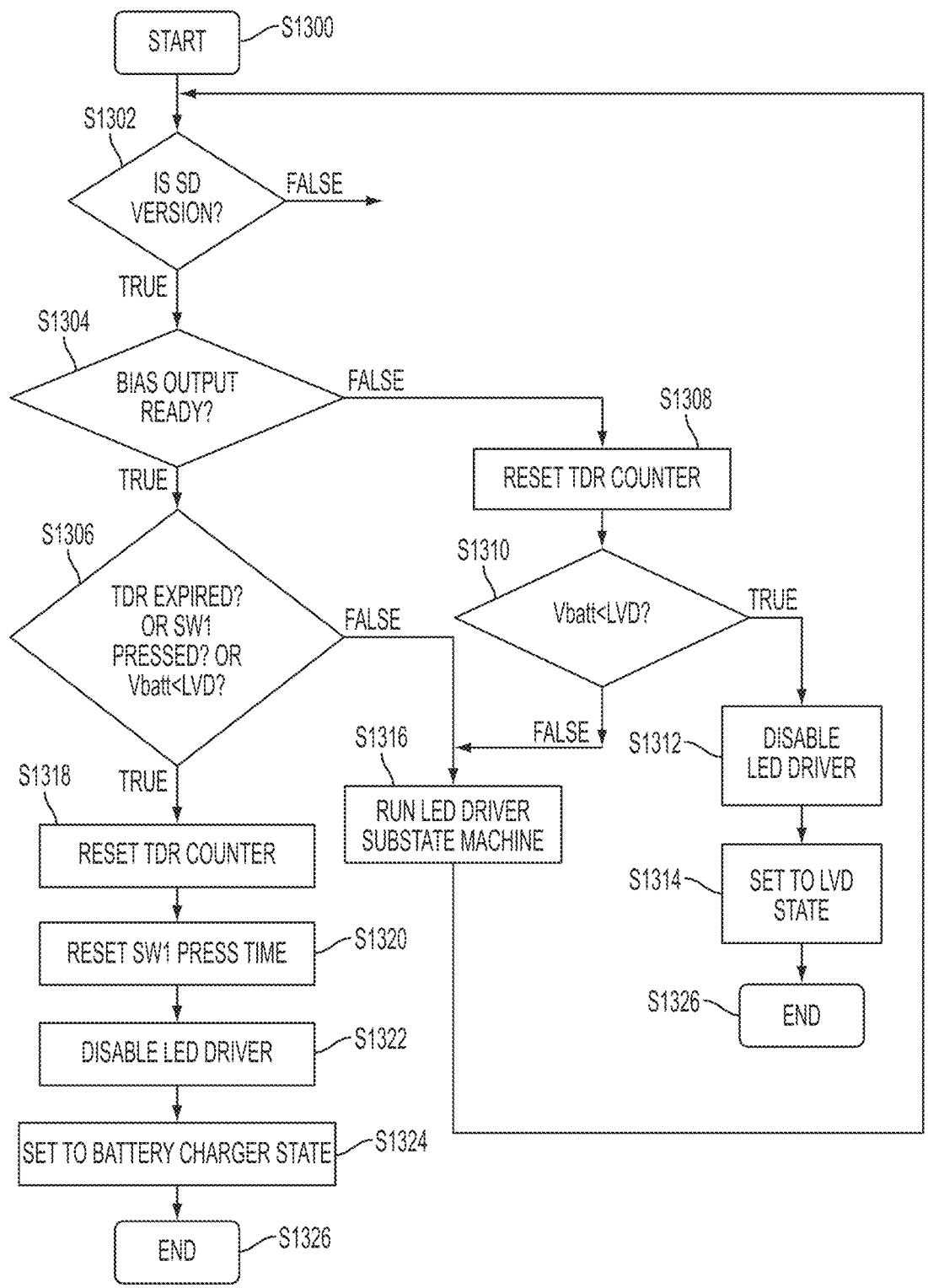
FIG. 13 is a process flow diagram illustrating another exemplary emergency state for LED based emergency lighting equipment according to another exemplary embodiment of the present application.

FIG. 12 is an illustrative example of an emergency state which includes process flow and functionality as defined by the annotated states S1200 through S1218. FIG. 13 is another illustrative example of an emergency state which includes process flow and functionality as defined by the annotated states S1300 through S1326, where states S1300, S1302, S1304, S1310, S1312, S1314, S1316, S1322, S1324, S1326 parallel states S1200, S1202, S1204, S1206, S1212, S1214, S1216, S1208, S1210, S1218, respectively, and further provide for a self-diagnostics capability as shown by states S1306, 1308, 1318, 1320.

Figure 14:
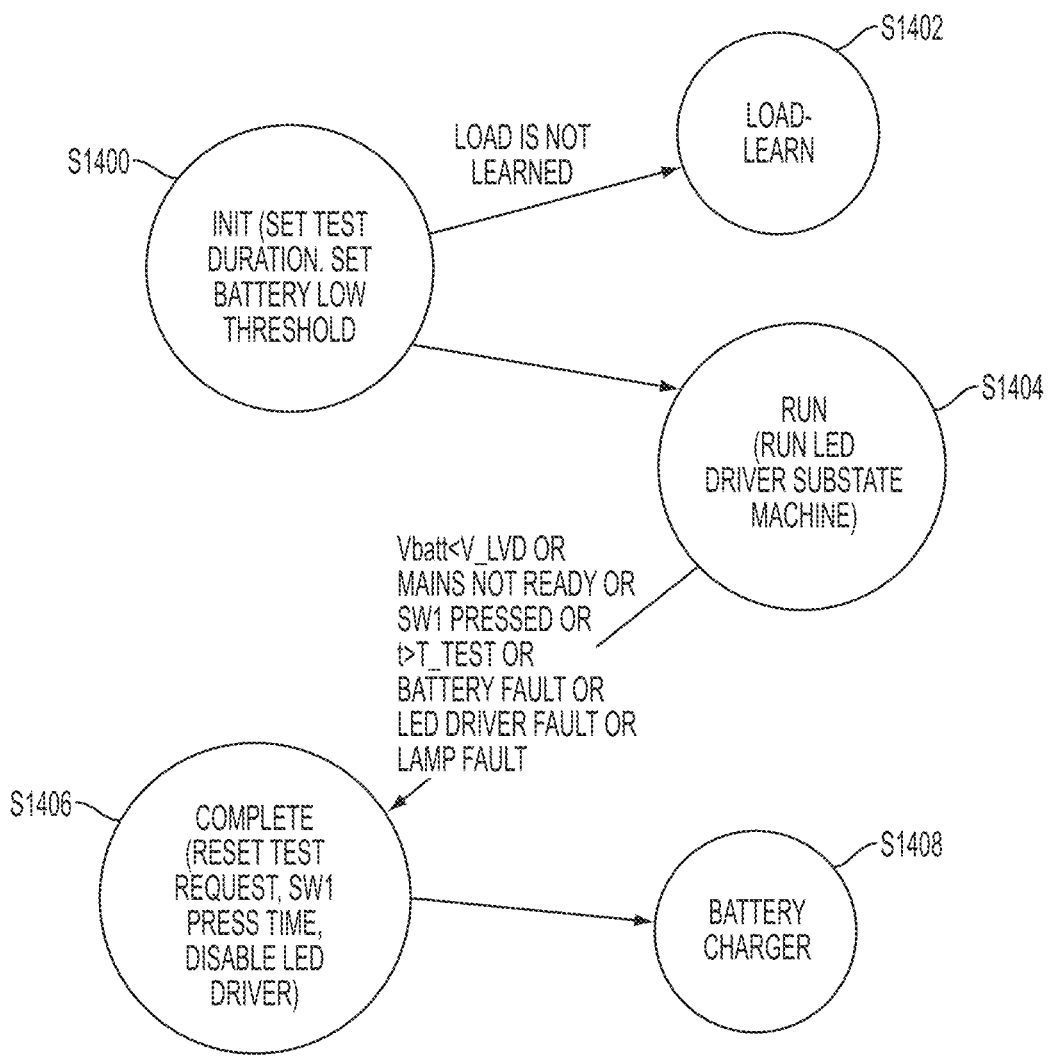
FIG. 14 is a state diagram illustrating an exemplary test state for LED based emergency lighting equipment according to an exemplary embodiment of the present application.
Figure 15:
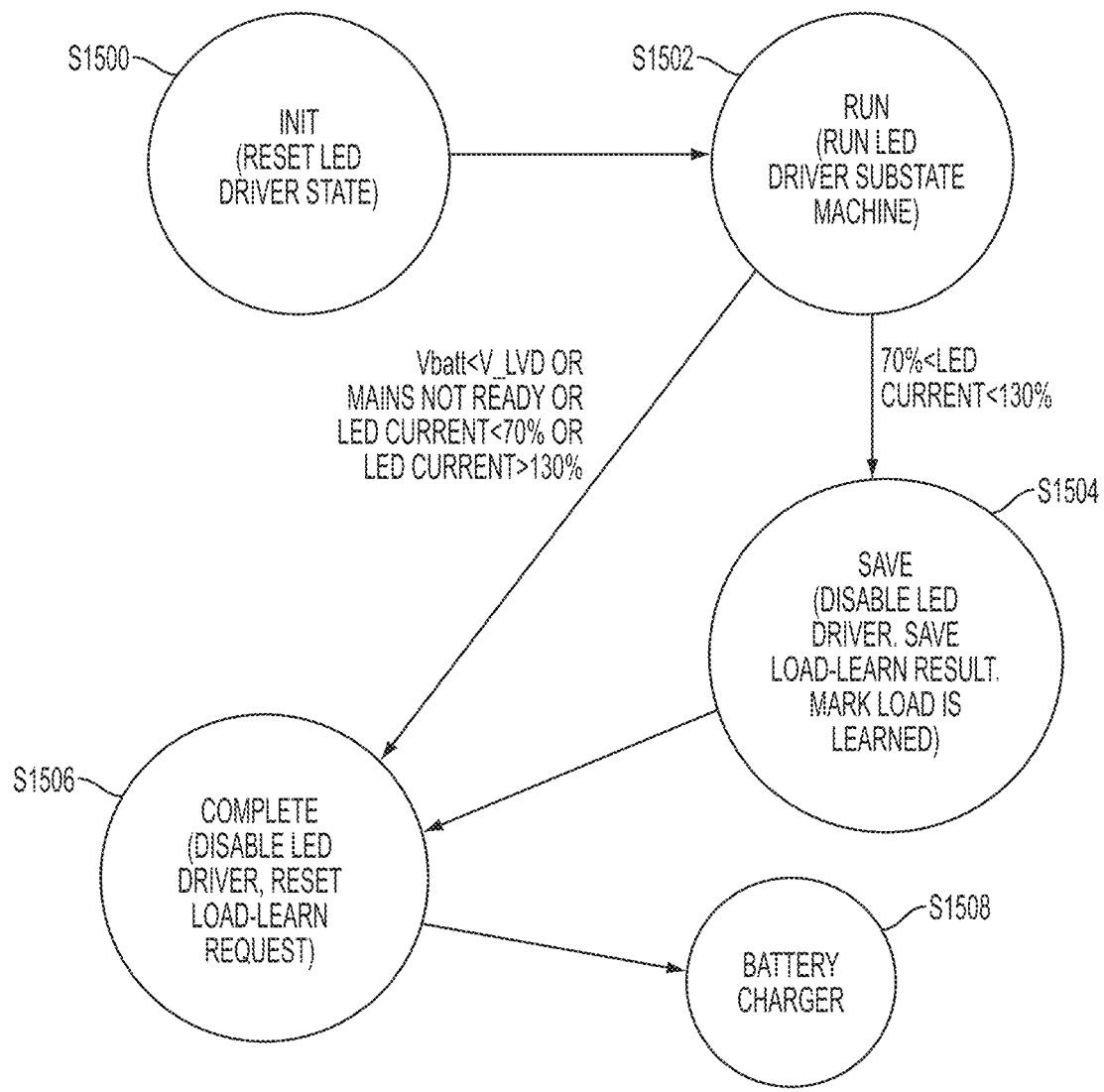
FIG. 15 is a state diagram illustrating an exemplary load-learn state for LED based emergency lighting equipment according to an exemplary embodiment of the present application.

FIG. 14 is an illustrative example of test state (see for example, Test state S708 of FIG. 7) which includes process flow and functionality as defined by the annotated states S1400 through S1408. FIG. 15 is an illustrative example of a load-learn state (see for example, Load-learn state S706 of FIG. 7) which includes process flow and functionality as defined by the annotated states S1500 through S1508.

Figure 16:
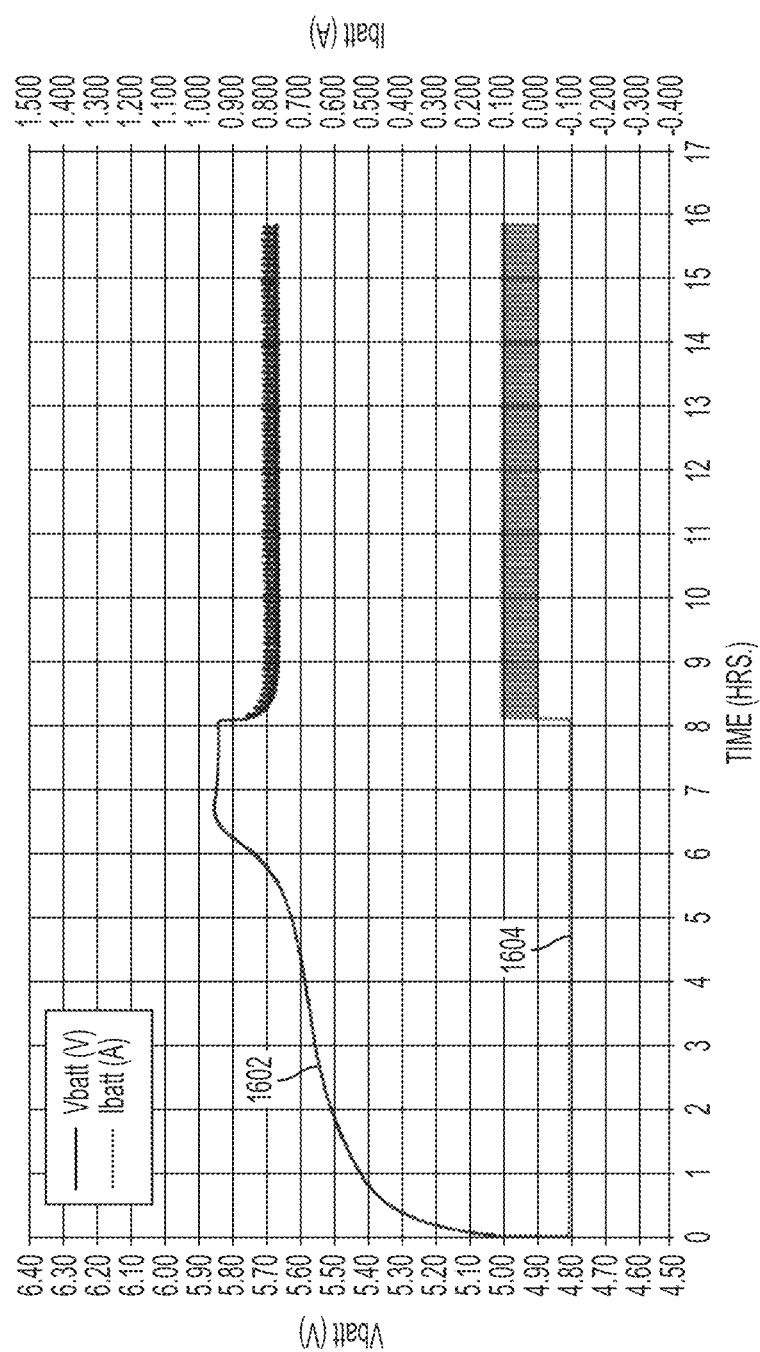
FIG. 16 is a plot illustrating an exemplary battery charge cycle according to exemplary embodiments of the present application.

FIG. 16 provides an illustrative example 1600 of a battery voltage 1602 and current charge 1604 profile for deltaV/deltaT method according to an exemplary embodiment of the present application. As illustrated in FIG. 16, according to an exemplary implementation, an amount of charge during a given charging period can be set based on battery capacity C. For example, a bulk charge period can be about 200 mA which is a C/6.5 charge rate for a 1300 mAh battery. On the other hand, the trickle charge rate can have a lower value of about 100 mA during Tickle Charge High state which is C/13 rate for a 1300 mAh battery. According to yet another exemplary implementation on and off times of the charger during the trickle charge state are about one minute at C/13 during Trickle Charge High state followed by being about zero for about 5 minutes (Trickle Charge Low state).

According to yet another exemplary embodiment of the present application, because the LED light source allowed the battery size to be significantly reduced the design of the unit was able to incorporate an AC-DC switch-mode fly-back converter to replace the bulky 60 Hz magnetic step down transformer typically found in traditional emergency lighting units. Moving to this type of circuit topology allowed a significant reduction in the size and weight of the charger and allowed the overall unit to assume a smaller size that is preferred by our customers. In addition to the reduction in size the fly-back converter style charger is designed to operate from a wide supply range. Because the charger can operate properly from 102-305 VAC, only two AC input supply wires are required. Traditional emergency lighting units with 60 Hz. magnetic transformers rely on voltage taps on the transformer primary to allow voltages of 120V or 277V to operate the unit. Because the installer has to select the proper voltage tap when the traditional emergency lighting unit is installed there is a chance that the wrong tap can be selected. When this happens in the field either the unit will not charge the battery or damage to the transformer can occur. By moving to the wide supply range type fly-back converter the risk that the voltage tap can be improperly connected is eliminated.

While the fly-back converter design eliminates the chance that the unit will be improperly wired to the incorrect voltage tap, it does present challenges to properly detecting brown-out voltage conditions. Prior techniques, such as one described in U.S. Pat. No. 7,256,556, addressed this problem by integrating a microprocessor on the primary side of the fly-back converter to determine the connected input voltage and set a brownout threshold based on the input voltage level detected. While this system can detect all common distribution voltages between 102-305 VAC and works independently of the connected line frequency (50 or 60 Hz) for voltages such as 220V 50 Hz, it is a very costly method of establishing the appropriate brownout threshold due primarily to the cost of the microprocessor on the primary side of the circuit. Given that the common distributor stock products only operate from 120 or 277 V 60 Hz an exemplary embodiment of the present application provides a low cost method of generating a brownout signal at the appropriate voltage level without having to measure the incoming AC signal level to determine the required brownout threshold level. By limiting the allowable input voltage to 120 or 277 VAC 60 Hz this application realizes a low cost brownout detection circuit that does not require the emergency lighting unit to learn the connected AC voltage level when the unit is connected to the AC line.

According to an exemplary implementation of the present application, the operation of the unit is restricted to two valid input voltage ranges and one valid input operating frequency, whereby the brownout voltage levels can be established with discreet circuitry prior to connection to an AC line voltage. Yet another exemplary implementation of the present application uses a brownout detection pin provided on most AC-DC fly-back controller ICs. Using this pin eliminates the need to communicate the brownout signal to the emergency lighting control and battery charging circuitry that is typically located on the low voltage isolated secondary side of the fly-back converter circuitry. Because the need to communicate the brownout signal to the secondary side of the circuit is eliminated in the application the need to provide an isolation element such as an opto-coupler to communicate the brownout signal across the isolation barrier is eliminated.

In an exemplary embodiment of the present application, a brown-out detection method is implemented as follows.

The unit is required to respond to two different brown-out levels automatically. When the input voltage is 120V nominal, it needs to detect brown-out at about 75% of 120V, which is about 90 VAC. When the input voltage is 277V nominal, it needs to detect brown-out at about 75% of 277V, which is about 208 VAC. Additionally, at least about +/−2% of hysteresis needs to be provided to prevent from possible oscillation at the boundary condition.

In an exemplary implementation as illustrated in FIG. 1, VIPER17 of section 104 along with TS4431 of section 102 and a few peripheral components are used to realize this 2-level brown-out detection method. Referencing the schematics of FIG. 1, pin 5 of VIPER17 is set for a brown-out threshold at 0.45V with 50 mV hysteresis. R1, R2, R7, and R10 are used to sense AC input voltage and the threshold is set to be around 150 VAC. So when the input voltage is lower than 150 VAC, R3, R6, R11, and R14 are used as a voltage divider to realize the first level brown-out detection function. When the input voltage is higher than 150 VAC, TS4431 is engaged and puts R12 in parallel with R14 by its internal open-collector transistor, so that R3, R6, R11, R14 and together with R12 are used as a voltage divider to realize the second level brown-out detection function.

An exemplary operation of brow-out circuitry for an LED-based emergency lighting system or equipment according to an exemplary embodiment of the present application is described as follows with reference to FIGS. 1 through 5F.

Referring to the example of FIG. 1, the brown-out circuit shown in section 102 uses an open collector shunt reference (U2) in conjunction with a voltage divider circuit (R1, R2, R7, and R10) that creates a DC voltage at pin 4 of (U2) that is proportional to the bulk DC input voltage created in section 100 of the circuit diagram by full wave rectifying the incoming AC input voltage. This incoming DC reference signal at pin 4 of (U2) that is proportional to the AC line is used to establish a threshold where the open collector transistor in (U2) turns on or off In this exemplary embodiment of the application, that threshold is set to approximately 150 VAC. This level was chosen to be above any expected high line conditions for a 120V nominal input voltage and well below any expected low line condition for a nominal 277V input. This method of predetermining an above or below threshold level in conjunction with the open collector switch in U2 gives the circuitry the means to adjust the proportionality of the brownout signal used to turn on or off the fly-back control circuit IC via pin 5 on (U1) shown in section 104 of the circuit diagram.

In normal operation, according to an exemplary implementation, the proportionality of the voltage divider made up of (R1, R2, R7, and R10) is chosen such that an input to the reference pin of (U2) is less than the internal reference in the IC of 1.224V. Since the reference signal is lower than the internal reference signal, the output of the error amplifier in (U2) controls the internal open collector transistor to the off or open state. Because the open collector transistor in (U2) is off for voltage levels less than approximately 150 VAC, the brown-out threshold for the circuit is established by the voltage divider made up of (R3, R6, R11 and R14) and the brown-out detect pin threshold voltage level for the fly-back control circuit IC (U1). Without the open collector switch in U2 switched off, the voltage divider made up of (R3, R6, R11 and R14) establishes a DC voltage at pin 5 of (U1) that goes below the internal brownout threshold level (0.45V) for pin 5 of (U1) when the AC input line voltage drops below approximately 80 VAC. Once this level is reached the fly-back control IC (U1) of the circuit turns off the fly-back converter and simulates a total power failure condition on the output of the fly-back converter that cause the unit to move to emergency mode and operate the LED lamps.

In an exemplary implementation, (U1) is equipped with internal hysteresis circuitry such that the DC input level at pin 5 of (U1) has to increase to (0.05V) for U1 to turn back on the fly-back converter so the unit can enter the charging state again. The DC input level of (0.05V) at pin 5 equates to approximately 96 VAC input line voltage condition. According to an exemplary embodiment of the present application, such hysteresis circuitry can prevent a rapidly changing circuit state condition if the incoming line was fluctuating between two points slightly above and below the AC line input voltage threshold.

Next, according to an exemplary implementation of embodiments of the present application, for voltage levels above the 150 VAC threshold of the brownout circuit shown in section 102 of the schematic of FIG. 1. The DC input circuit level presented to pin 4 of (U2) is above the 1.224V internal voltage reference causing the internal error amplifier in (U2) to control on or close the switch connecting resistor R12 to ground. When the switch is closed (R12) is placed in parallel with (R14) in the voltage divider circuit made up of (R3, R6, R11 and R14). By placing (R12) in parallel with R14 the value of the lower resistor in the divider circuit is changed, in an exemplary implementation, from 13.7 k ohms to 5.15 k ohms. Lowering the value of the lower resistor in the divider circuit has the effect of requiring a higher AC input voltage level needed to generate the (0.45 VDC) level at pin 5 of (U1) required for the unit to enter the brown-out state. The parallel combination of resistors (R12 and R14) changes the proportionality ratio of the voltage diver such that the AC line voltage drops to approximately 220 VAC for the unit to enter the brown-out mode. Likewise, according to an exemplary implementation, the new proportionality established by the resistors (R12, R14 parallel combination) establishes a threshold of approximately 230 VAC to turn off the LED lamps and move back to the charging state.

Thus, the application provides, among other things, a {text}. Various features and advantages of the application are set forth in the following claims.

What is claimed is:

1. A brown-out detection apparatus comprising:
a voltage sensing circuit sensing an input AC voltage, said input AC voltage having a first nominal input voltage value or a second nominal input voltage value, said voltage sensing circuit including an output outputting a reference DC voltage proportional to said input AC voltage, wherein said voltage sensing circuit incudes a rectifying circuit for rectifying said input AC voltage and outputting a bulk DC voltage;
a first circuit responsive to said output of said voltage sensing circuit, said first circuit including a first output outputting a first voltage value when said input AC voltage is below a threshold voltage level and outputting a second voltage value when said input AC voltage is above said threshold level;
a second circuit responsive to said first output of said first circuit, said second circuit including a second output outputting a second control signal indicative of a brown-out condition of said input AC voltage based on said first or second voltage value output of said first circuit and an internal brown-out threshold value; and
a first voltage divider circuit receiving said bulk DC voltage and outputting said reference DC voltage,
said first circuit including a first integrated circuit and a second voltage divider circuit, said first integrated circuit outputting a first control signal based on said reference DC voltage and said threshold voltage level, and
said second voltage divider circuit responsive to said first control signal selectively outputting said first voltage value or said second voltage value.

2. The apparatus of claim 1, wherein said threshold voltage level has a value above a high line condition for said first nominal input voltage value of said input AC voltage and below a low line condition for said second nominal input voltage value of said input AC voltage.

3. The apparatus of claim 2, wherein said first nominal value of said input AC voltage is about 120 Volts, and said second nominal value of said input AC voltage is about 277 Volts.

4. The apparatus of claim 1, wherein the rectifying circuit is a full wave rectifying circuit.

5. The apparatus of claim 1, wherein said reference DC voltage is proportional said bulk DC voltage.

6. The apparatus of claim 1, wherein said second circuit includes a second integrated circuit having a fly-back control circuit selectively turned on or off based on said internal brown-out threshold value and in response to said first or second voltage value output of said second voltage divider circuit.

7. The apparatus of claim 1, wherein said internal brown-out threshold value is based on characteristics of said fly-back control circuit.

8. A brown-out detection method comprising:
sensing an input AC voltage having a first nominal input voltage value or a second nominal input voltage value;
outputting a reference DC voltage proportional said input AC voltage;
outputting in response to said reference DC voltage a first voltage value when said input AC voltage is below a threshold voltage level, or a second voltage value when said input AC voltage is above said threshold level;
outputting a second control signal indicative of a brown-out condition of said input AC voltage based on said first or second voltage value and an internal brown-out threshold value;
configuring a voltage sensing circuit for said sensing said input AC voltage, said voltage sensing circuit including an output for said outputting of said reference DC voltage proportional said input AC voltage;
configuring a first circuit connected to said output of said voltage sensing circuit, said first circuit including a first output for said outputting of said first voltage value when said input AC voltage is below said threshold voltage level and said second voltage value when said input AC voltage is above said threshold level; and
configuring a second circuit responsive to said first output of said first circuit, said second circuit including a second output for said outputting of said second control signal indicative of said brown-out condition of said input AC voltage based on said first or second voltage value output of said first circuit and said internal brown-out threshold value.

9. The method of claim 8, wherein said threshold voltage level has a value above a high line condition for said first nominal input voltage value of said input AC voltage and below a low line condition for said second nominal input voltage value of said input AC voltage.

10. The method of claim 8, wherein said voltage sensing circuit incudes a rectifying circuit for rectifying said input AC voltage and outputting a bulk DC voltage.

11. The method of claim 10, wherein the rectifying circuit is a full wave rectifying circuit.

12. The method of claim 10, wherein said reference DC voltage is proportional said bulk DC voltage.

13. The method of claim 10, further comprising configuring a first voltage divider circuit receiving said bulk DC voltage and outputting said reference DC voltage,
said first circuit including a first integrated circuit and a second voltage divider circuit,
said first integrated circuit outputting a first control signal based on said reference DC voltage and said threshold voltage level, and
said second voltage divider circuit responsive to said first control signal selectively outputting said first voltage value or said second voltage value.

14. The method of claim 13, wherein said second circuit includes a second integrated circuit having a fly-back control circuit selectively turned on or off based on said internal brown-out threshold value and in response to said first or second voltage value output of said second voltage divider circuit.

15. The method of claim 13, wherein said internal brown-out threshold value is based on characteristics of said fly-back control circuit.

\* \* \* \* \*